United States Patent
Miyajima

(10) Patent No.: US 7,130,016 B2
(45) Date of Patent: Oct. 31, 2006

(54) EXPOSURE APPARATUS AND DEVICE MANUFACTURING METHOD

(75) Inventor: Yoshikazu Miyajima, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 81 days.

(21) Appl. No.: 11/048,762

(22) Filed: Feb. 3, 2005

(65) Prior Publication Data

US 2005/0168712 A1     Aug. 4, 2005

(30) Foreign Application Priority Data

Feb. 3, 2004    (JP)    ............................. 2004-027125

(51) Int. Cl.
  *G03B 27/52*    (2006.01)
  *G03B 27/42*    (2006.01)
(52) U.S. Cl. .......................................... 355/30; 355/53
(58) Field of Classification Search ................. 355/30, 355/53, 77; 414/935, 939, 940
See application file for complete search history.

(56) References Cited

U.S. PATENT DOCUMENTS

| | | | | |
|---|---|---|---|---|
| 5,559,584 | A * | 9/1996 | Miyaji et al. ................... | 355/73 |
| 6,262,794 | B1 | 7/2001 | Miyajima ...................... | 355/53 |
| 6,335,787 | B1 | 1/2002 | Nishi ........................... | 355/67 |
| 6,545,746 | B1 | 4/2003 | Nishi ........................... | 355/53 |
| 6,614,504 | B1 * | 9/2003 | Aoki et al. ..................... | 355/30 |
| 6,704,088 | B1 * | 3/2004 | Tanimoto ....................... | 355/30 |
| 6,801,301 | B1 | 10/2004 | Miyajima et al. ............... | 355/72 |
| 6,829,038 | B1 * | 12/2004 | Miwa ............................ | 355/53 |
| 6,842,221 | B1 * | 1/2005 | Shiraishi ........................ | 355/30 |
| 6,961,114 | B1 * | 11/2005 | Murayama et al. ............. | 355/30 |
| 2003/0151728 | A1 | 8/2003 | Nishi ............................ | 355/30 |
| 2005/0128446 | A1 * | 6/2005 | Miyajima ....................... | 355/30 |
| 2005/0140947 | A1 | 6/2005 | Miyajima ....................... | 355/30 |
| 2005/0219501 | A1 | 10/2005 | Sato et al. ..................... | 355/72 |
| 2005/0275821 | A1 | 12/2005 | Miyajima ....................... | 355/69 |

FOREIGN PATENT DOCUMENTS

| | | |
|---|---|---|
| JP | 9-246140 | 9/1997 |
| JP | 2821795 | 9/1998 |
| JP | 2000-12412 | 1/2000 |
| JP | 2002-203771 | 7/2002 |

* cited by examiner

*Primary Examiner*—Alan Mathews
(74) *Attorney, Agent, or Firm*—Fitzpatrick, Cella, Harper & Scinto

(57) ABSTRACT

An exposure apparatus includes a plurality of chambers which respectively have openings and are connected to each other to be able to communicate with each other through the openings, and a suppressing system which suppresses a gas from flowing into at least one of the plurality of chambers through the openings after disconnection of the plurality of chambers. The one of the plurality of chambers has a projection, another one of the plurality of chambers has a recess, and the one chamber and the other chamber are connected to each other as the projection is fitted in the recess.

10 Claims, 18 Drawing Sheets

EXPOSURE APPARATUS AND DEVICE MANUFACTURING METHOD

FIELD OF THE INVENTION

The present invention relates to an exposure apparatus and a device manufacturing method.

BACKGROUND OF THE INVENTION

Conventionally, various types of exposure apparatuses have been developed to increase the integration density and decrease the feature size of the patterns of a semiconductor integrated circuit, or the like (see Japanese Patent Laid-Open Nos. 2000-012412, 09-246140, and 2002-203771 and Japanese Patent No. 02821795). FIGS. 16, 17A, and 17B are views showing the structure of a conventional exposure apparatus. Referring to FIG. 16, the interior of a light source 101 is maintained at a vacuum. Full-spherical light from the light source 101 is aligned in the light-emitting direction by a light source mirror and focused and reflected to form an EUV light-emitting point. A light source mount surface plate 102 anti-vibrates and positions the light source 101. A light source mount 103 supports and anti-vibrates the light source mount surface plate 102. An illumination system 104 is an exposure light introducing portion which introduces exposure light 107 from the light source 101. The illumination system 104 is formed of mirrors and shapes the exposure light 107 by uniforming. An illumination system mount surface plate 105 anti-vibrates and positions the illumination system 104. An illumination system mount 106 supports and anti-vibrates the illumination system mount surface plate 105. The exposure light 107 emerges as it is transmitted through the illumination system 104.

A reticle 108 is a master having a reflection pattern to be projected and exposed. A reduction projection mirror optical system 109 reduces and projects an exposed pattern reflected on the reticle 108. The reduction projection mirror optical system 109 projects and reflects light by a plurality of mirrors to finally reduce and project light with a specific reduction ratio.

A wafer 110 is a substrate on which the reflected, reduced, and projected pattern of the reticle 108 is to be exposed. A wafer stage 111 aligns the wafer 110 at a predetermined exposure position. The wafer stage 111 is alignment-controlled to be capable of driving in the six axis directions, i.e., the X-axis direction, Y-axis direction, Z-axis direction, tilt about the X-axis, tilt about the Y-axis, and rotation about the Z-axis. A wafer stage mount surface plate 115 is supported by a wafer stage mount 116 serving as anti-vibrating means, and supports and anti-vibrates the wafer stage 111 with respect to the apparatus installation floor.

A reticle stage 112 mounts on it the reticle 108 as an exposure pattern reflecting master. A reticle stage mount surface plate 113 is supported by a reticle stage mount 114 serving as an anti-vibrating means, and supports and anti-vibrates the reticle stage 112 with respect to the apparatus installation floor. A projection system mount surface plate 117 is supported by a projection system mount 118 serving as an anti-vibrating means, and supports the projection optical system 109 with respect to the apparatus installation floor.

A vacuum pump 119, vacuum pump 120, and vacuum pump 121 are supported by a main body structure 122 (see FIGS. 17A and 17B). The vacuum pump 119, vacuum pump 120, and vacuum pump 121 respectively maintain the space around the reticle stage 112, space around the projection optical system 109, and space around the wafer stage 111, where a vacuum chamber 123 forms vacuum partitions, to vacuum states of about $10^{-3}$ Pa to $10^{-4}$ Pa.

Conventionally, in the exposure apparatus having the above structure, when accessing the space around the reticle stage 112, space around the projection optical system 109, and space around the wafer stage 111 for the purpose of maintenance, or the like, the respective modules are separated, as shown in FIGS. 17A and 17B.

More specifically, as shown in FIG. 17A, when accessing the reticle stage 112 and its peripheral portion, the main body structure 122 is separated and a vacuum chamber 123A is separated from the vacuum chamber 123, so that the module of the reticle stage 112 retreats and separates upward.

As shown in FIG. 17B, when accessing the projection optical system 109, wafer stage 111, and their peripheral portions, the main body structure 122 is further separated and a vacuum chamber 123B and vacuum chamber 123C are separated from each other, so that the module of the projection optical system 109 retreats and separates upward.

In this manner, conventionally, when accessing modules and components in a vacuum chamber or dividing and transporting the apparatus, the respective modules are separated and divided.

Conventionally, however, when opening and dividing the chamber, a chamber including a module or component, which is not an access target, must also be opened. Therefore, a contaminant, moisture, or the like, attaches not only to the module or component as the access target, but also, a module or component, which is not an access target, thus, contaminating the interiors of the chambers.

SUMMARY OF THE INVENTION

The present invention has been made in view of the above problems, and has as its exemplary object to decrease contamination in the chamber.

According to the first aspect of the present invention, there is provided an exposure apparatus comprising a plurality of chambers which respectively have openings and are connected to each other to be able to communicate with each other through the openings, and a suppressing system which suppresses a gas from flowing into at least one of the plurality of chambers through the opening after disconnection of the plurality of chambers.

According to the second aspect of the present invention, there is provided an exposure apparatus, which has a projection optical system and projects a pattern of an original held by an original stage onto a substrate held by a substrate stage using exposure light through the projection optical system, the apparatus comprising a first chamber which accommodates the original stage, a second chamber which accommodates the projection optical system, and a third chamber which accommodates the substrate stage, wherein the first, second and third chambers are connected to one another and respectively have openings through which the exposure light passes, and the exposure apparatus further comprises a suppressing system which suppresses a gas from flowing into at least one of the first, second and third chambers through the opening after disconnection of the first, second and third chambers.

According to the third aspect of the present invention, there is provided a device manufacturing method comprising steps of transferring a pattern to an object using the exposure apparatus described above, and developing the object to which the pattern has been transferred.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The preferred embodiments of the present invention will be described with reference to the accompanying drawings.

First Embodiment

Figure 1:
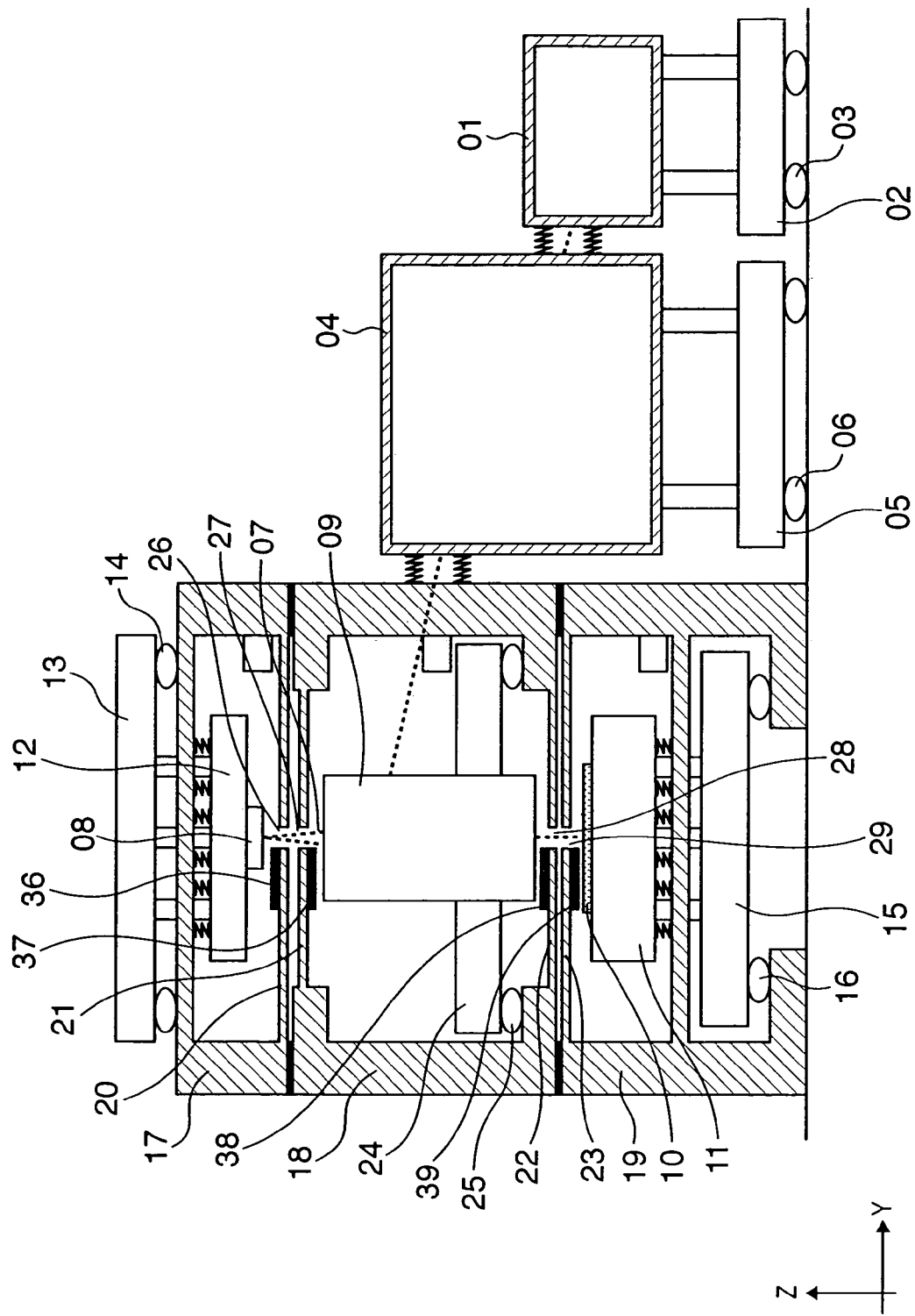
FIG. 1 is a view showing the structure of an exposure apparatus according to the first preferred embodiment of the present invention.

FIG. 1 is a view showing the structure of an exposure apparatus according to the first preferred embodiment of the present invention.

The interior of a light source 1 is maintained at a vacuum. Full-spherical light from the light source 1 is aligned in the light-emitting direction by a light source mirror and focused and reflected to form an EUV light-emitting point. A light source mount surface plate 2 anti-vibrates and positions the light source 1. A light source mount 3 supports and anti-vibrates the light source mount surface plate 2. An illumination system 4 is an exposure light introducing portion which introduces exposure light 7 from the light source 1. The illumination system 4 is formed of mirrors and shapes the exposure light 7 by uniforming. An illumination system mount surface plate 5 anti-vibrates and positions the illumination system 4. An illumination system mount 6 supports and anti-vibrates the illumination system mount surface plate 5. The exposure light 7 emerges as it is transmitted through the illumination system 4. A reticle 8 is a master having a reflection pattern to be projected and exposed. A reduction projection mirror optical system 9 reduces and projects an exposed pattern reflected on the reticle 8. The reduction projection mirror optical system 9 projects and reflects light by a plurality of mirrors to finally reduce and project light with a specific reduction ratio.

A wafer 10 is a substrate (e.g., a semiconductor material, such as silicon or a compound semiconductor) on which the reflected, reduced, and projected pattern of the reticle 108 is to be exposed. A wafer stage 11 aligns the wafer 10 at a predetermined exposure position. The wafer stage 11 is alignment-controlled to be capable of driving in six axis directions, i.e., the X-axis direction, Y-axis direction, Z-axis direction, tilt about the X-axis, tilt about the Y-axis, and rotation about the Z-axis. A wafer stage mount surface plate 15 is supported by a wafer stage mount 16 serving as an anti-vibrating means, and supports and anti-vibrates the wafer stage 11 with respect to the apparatus installation floor.

A reticle stage 12 mounts on it the reticle 8 as an exposure pattern reflecting master. A reticle stage mount surface plate 13 is supported by a reticle stage mount 14 serving as an anti-vibrating means, and supports and anti-vibrates the reticle stage 12 with respect to the apparatus installation floor.

A vacuum chamber 17 is a vacuum partition which defines the space around the reticle stage 12. The vacuum chamber 17 has a separating partition 20, which separates the space around the reticle stage 12 and the space around the projection optical system 9 from each other to form an enclosed structure. A vacuum chamber 18 is a vacuum partition, which defines the space around the projection optical system 9. The vacuum chamber 18 has a separating partition 21, which separates the space around the reticle stage 12 and the space around the projection optical system 9 from each other to form an enclosed structure. The vacuum chamber 18 also has a separating partition 22, which separates the space around the wafer stage 11 and the space around the projection optical system 9 from each other to form an enclosed structure. A vacuum chamber 19 is a vacuum partition which defines the space around the wafer stage 11. The vacuum chamber 19 has a separating partition 23, which separates the space around the wafer stage 11 and the space around the projection optical system 9 from each other to form an enclosed structure. The vacuum chamber 18 is detachably connected to the vacuum chamber 19. Similarly, the vacuum chamber 17 is detachably connected to the vacuum chamber 18.

A projection system mount surface plate 24 is supported by a projection system mount 25 serving as an anti-vibrating means, and supports and anti-vibrates the projection optical system 9 with respect to the apparatus installation floor. An exposure light transmission hole 26 is a transmission hole formed in the separating partition 20 to transmit the exposure light 7. An exposure light transmission hole 27 is a transmission hole formed in the separating partition 21 to transmit the exposure light 7. An exposure light transmission hole 28 is a transmission hole formed in the separating partition 22 to transmit the exposure light 7. An exposure light transmission hole 29 is a transmission hole formed in the separating partition 23 to transmit the exposure light 7.

A sealing lid 36 is a suppressing portion, which suppresses the exposure light transmission hole 26 from the external atmosphere to separate and seal the vacuum chamber 17 in an enclosed state. A sealing lid 37 is a suppressing portion, which suppresses the exposure light transmission hole 27 from the external atmosphere to separate and to seal the vacuum chamber 18 in an enclosed state. A sealing lid 38 is a suppressing portion, which suppresses the exposure light transmission hole 28 from the external atmosphere to separate and seal the vacuum chamber 18 in an enclosed state. A sealing lid 39 is a suppressing portion which suppresses the exposure light transmission hole 29 from the external atmosphere to separate and seal the vacuum chamber 19 in an enclosed state.

Figure 2A:
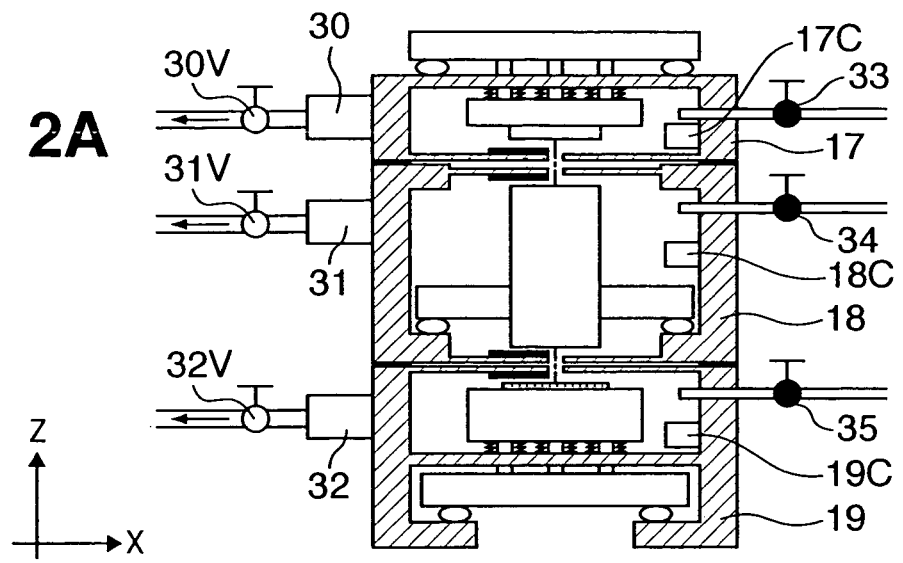
FIGS. 2A to 2C are views showing the structure of the exposure apparatus according to the first preferred embodiment of the present invention.
Figure 2B:
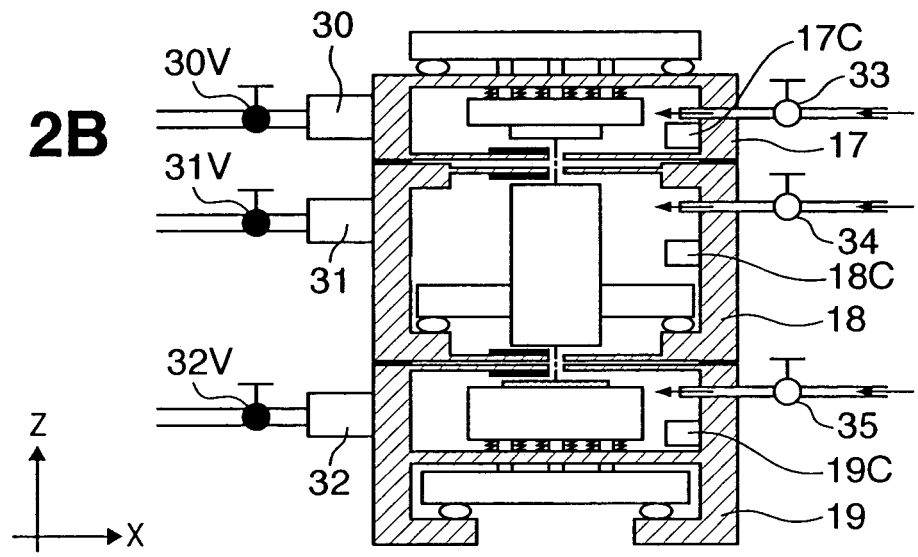
Figure 2C:
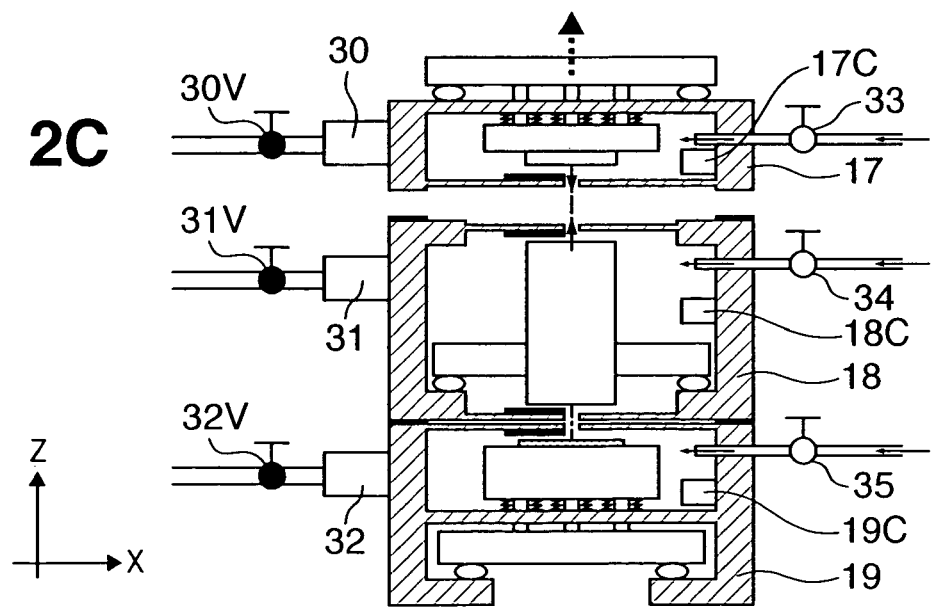

FIGS. 2A to 2C are views showing the gas system of the exposure apparatus according to the first embodiment.

A pressure gauge 17C measures the vacuum pressure in the vacuum chamber 17. A pressure gauge 18C measures the vacuum pressure in the vacuum chamber 18. A pressure gauge 19C measures the vacuum pressure in the vacuum chamber 19.

A vacuum pump 30 evacuates the space in the vacuum chamber 17 to a vacuum state. A vacuum pump valve 30V is a gate valve, which opens/closes the exhaust channel of the vacuum pump 30. A vacuum pump 31 evacuates the space in the vacuum chamber 18 to a vacuum state. A vacuum pump valve 31V is a gate valve, which opens/closes the exhaust channel of the vacuum pump 31. A vacuum pump 32 evacuates the space in the vacuum chamber 19 to a vacuum state. A vacuum pump valve 32V is a gate valve, which opens/closes the exhaust channel of the vacuum pump 32.

A nitrogen purge valve 33 is a gate valve, which opens/closes a supply line for supplying nitrogen purge gas into the vacuum chamber 17. A nitrogen purge valve 34 is a gate valve, which opens/closes a supply line for supplying nitrogen purge gas into the vacuum chamber 18. A nitrogen purge valve 35 is a gate valve which opens/closes a supply line for supplying nitrogen purge gas into the vacuum chamber 19.

The exposure apparatus operates while the space around the reticle stage 12, the space around the projection optical system 9, and the space around the wafer stage 11 are maintained in vacuum states of about $10^{-3}$ Pa to $10^{-4}$ Pa with the above structure by using the vacuum pumps 30 to 32. Although the inert gas is exemplified by nitrogen gas in the preferred embodiments of the present invention, any other inert gas can be used.

A procedure for separating the respective modules of the exposure apparatus according to this embodiment will be described below. This embodiment exemplifies a case of accessing the space around the reticle stage 12, the space around the projection optical system 9, the and space around the wafer stage 11 for the purpose of maintenance, or the like.

FIG. 2A is a view showing the operating state of the exposure apparatus. The vacuum pump valves 30V to 32V are open. The exposure apparatus operates while the space around the reticle stage 12 in the vacuum chamber 17, the space around the projection optical system 9 in the vacuum chamber 18, and the space around the wafer stage 11 in the vacuum chamber 19 are maintained in the vacuum states of about $10^{-3}$ Pa to $10^{-4}$ Pa by the vacuum pumps 30 to 32, respectively.

FIG. 2B is a view showing an example in which, in the operating state of FIG. 2A, the modules of the respective vacuum chambers are to be separated and exchanged or separated and transported for the purpose of maintenance, or the like. First, the vacuum pumps 30 to 32 are stopped, and the vacuum pump valves 30V to 32V are closed. Subsequently, the nitrogen purge valves 33 to 35 are opened. The nitrogen gas is supplied inside the vacuum partitions of the vacuum chambers 17 to 19. The nitrogen gas is kept supplied, while measuring the pressures inside the respective vacuum chamber partitions by the pressure gauges 17C to 19C, until the interiors inside the respective vacuum chamber partitions reach an atmospheric pressure. When it is confirmed by the pressure gauges 17C to 19C that the pressures inside the partitions of the respective chambers have become substantially equal to the atmospheric pressure, separation of the respective vacuum chambers is started as shown in FIG. 2C. More specifically, the vacuum chamber 17 is moved vertically with respect to the vacuum chamber 18.

Figure 3A:
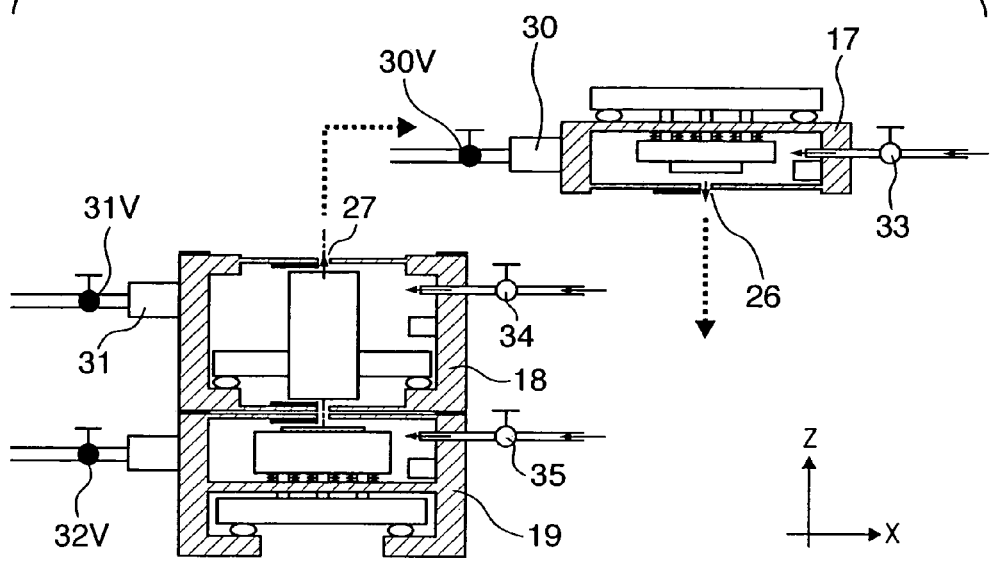
FIGS. 3A and 3B are views showing the structure of the exposure apparatus according to the first preferred embodiment of the present invention.

Then, the vacuum chamber 17 is moved and separated vertically, as shown in FIG. 3A. The nitrogen purge gas supplied into the respective vacuum chambers through the exposure light transmission hole 26 and exposure light transmission hole 27 is continuously exhausted to the external environment to suppress the external atmosphere flowing into the respective vacuum chambers. In this manner, in order to suppress the external atmosphere from flowing into the respective chambers, the chambers are separated, while discharging the nitrogen purge gas. Therefore, a contaminant, moisture, or the like, from the external atmosphere, can be prevented from attaching to the inner surfaces of the respective vacuum chambers.

Figure 3B:
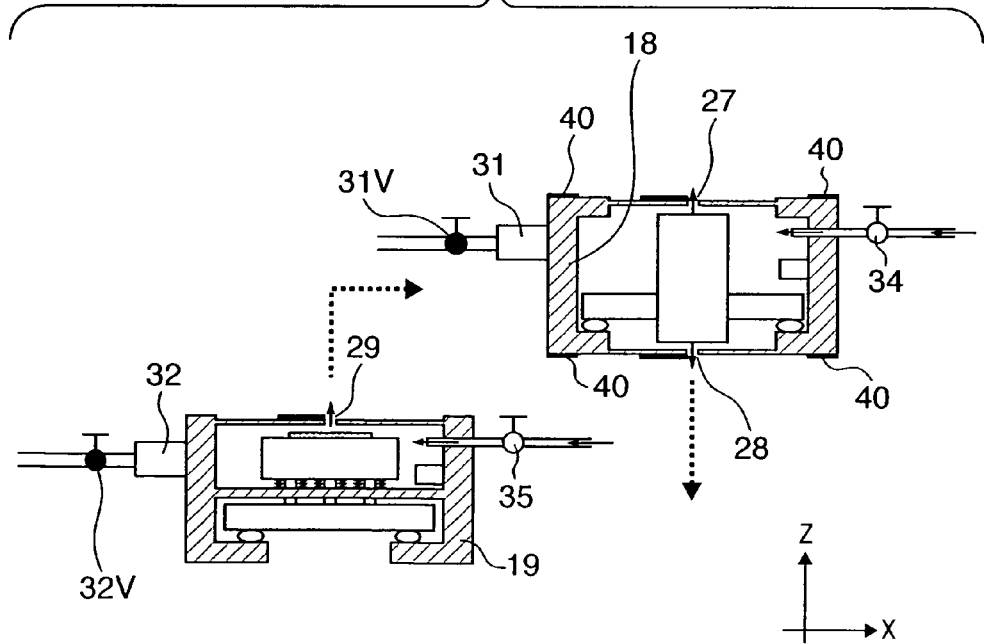

Subsequently, the vacuum chamber 18 is moved vertically with respect to the vacuum chamber 19. As shown in FIG. 3B, the vacuum chamber 18 is moved and separated vertically. The nitrogen purge gas supplied into the respective vacuum chambers through the exposure light transmission hole 27, the exposure light transmission hole 28, and the exposure light transmission hole 29 is continuously exhausted to the external environment to serve as suppressing systems. In this manner, in order to suppress the external atmosphere from flowing into the respective chambers, the chambers are separated, while discharging the nitrogen purge gas. Therefore, a contaminant, moisture, or the like, from the external atmosphere, can be suppressed and prevented from attaching to the inner surfaces of the respective vacuum chambers.

As described above, according to this embodiment, when the respective vacuum chambers are to be separated and exchanged or transported, the interiors of the vacuum chambers need not be opened and divided, unlike in the prior art. Therefore, the contaminant or moisture can be prevented from attaching to the inner surface of the vacuum chamber of a module that needs maintenance and exchange.

Also, a contaminant, moisture, or the like, will not attach to the internal structure and module of a vacuum chamber, other than a module that needs maintenance. Thus, contamination of the interior of the vacuum chamber can be prevented.

Second Embodiment

Figure 4A:
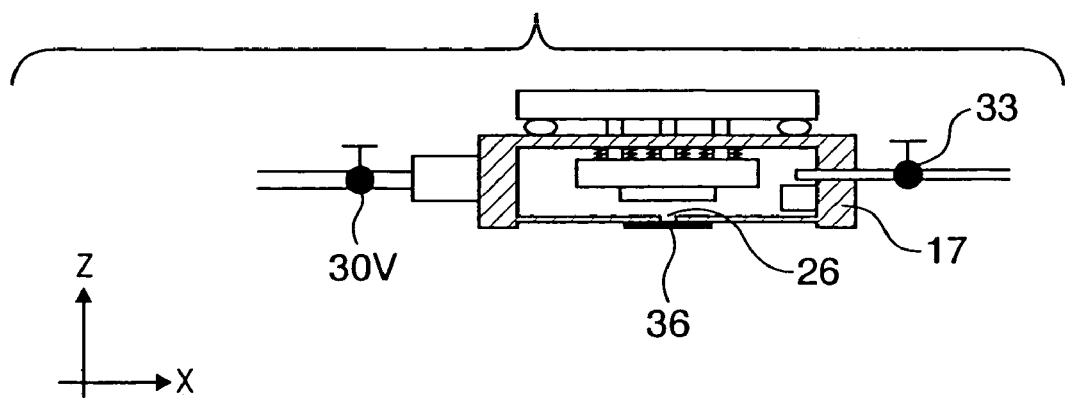
FIGS. 4A to 4C are views showing the structure of an exposure apparatus according to the second preferred embodiment of the present invention.
Figure 4B:
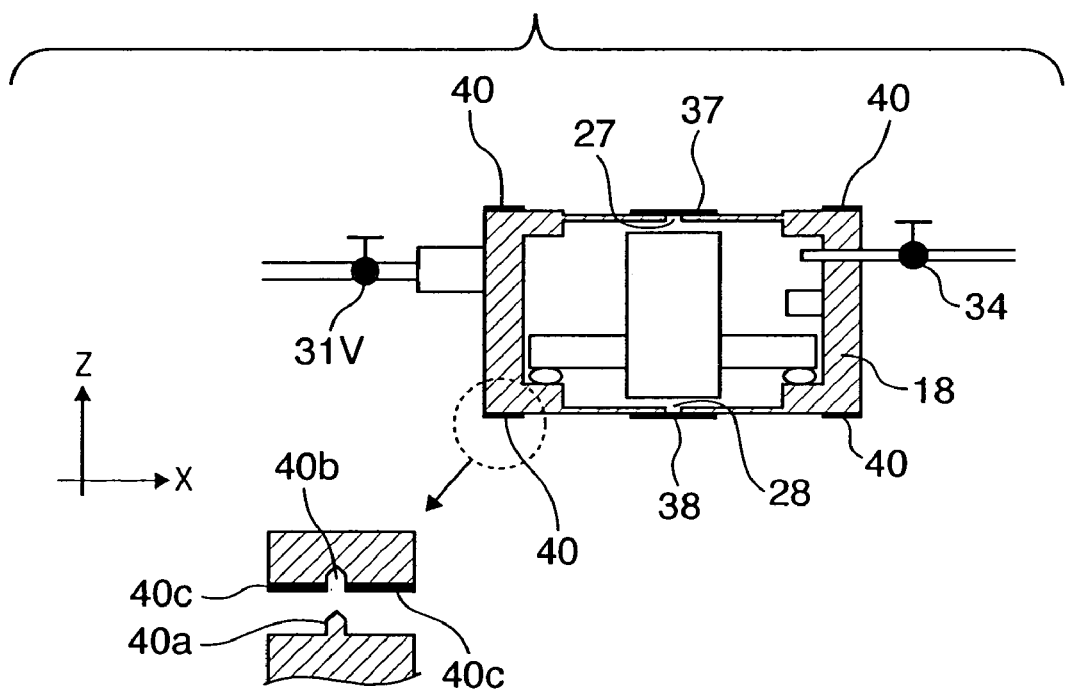
Figure 4C:
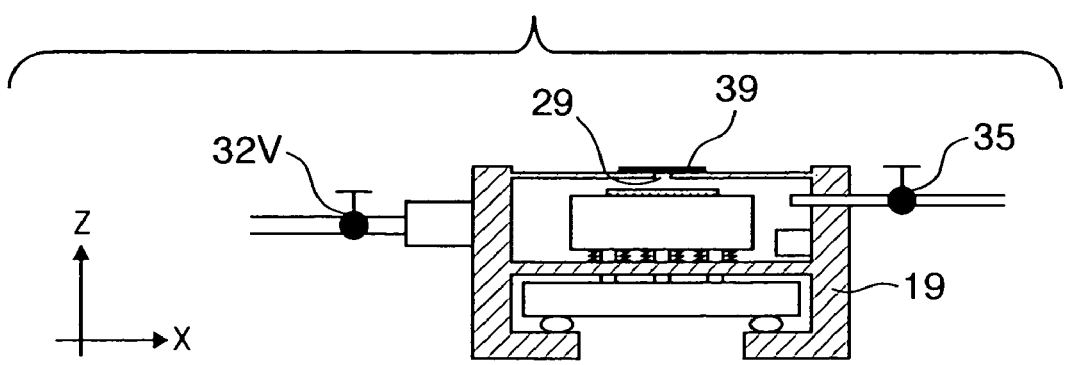

FIGS. 4A to 4C are views showing an exposure apparatus according to the second preferred embodiment of the present invention.

In the second embodiment, seal positioning members 40 are arranged on the joined seal surface between a vacuum chamber 17 and vacuum chamber 18, and the joined seal surface between the vacuum chamber 18 and a vacuum chamber 19. The seal positioning members 40 position the vacuum chambers relative to each other at the time of joining, and maintain the vacuum states inside the vacuum partitions of the chambers.

As shown in FIG. 4A, a nitrogen purge valve 33 is closed, and, simultaneously, an exposure light transmission hole 26 is closed by a sealing lid 36. Thus, the vacuum chamber 17 can be separated in a nitrogen purge sealed state.

Similarly, as shown in FIG. 4B, a nitrogen purge valve 34 is closed, and, simultaneously, an exposure light transmission hole 27 and exposure light transmission hole 28 are closed by a sealing lid 37 and sealing lid 38. Thus, the vacuum chamber B 18 can be separated in a nitrogen purge sealed state.

Similarly, as shown in FIG. 4C, a nitrogen purge valve 35 is closed, and, simultaneously, an exposure light transmission hole 29 is closed by a sealing lid 39. Thus, the vacuum chamber 19 can be separated in a nitrogen purge sealed state.

After the above separation, when the respective vacuum chambers are to be joined again, the seal positioning members 40 are arranged on the joined seal surfaces between the respective vacuum chambers position the respective vacuum chambers. Then, seal members 40c seal the portions around the seal positioning members 40, thereby integrating the respective chambers. More specifically, of the plurality of chambers, one chamber has a projection 40a, and another chamber has a recess 40b. Thus, the two chambers are connected to each other as the projection 40a is fitted in the recess 40b to align the two chambers.

Third Embodiment

FIGS. 5A to 5C and FIGS. 6A and 6B are views showing an exposure apparatus according to the third preferred embodiment of the present invention.

As a method of separating the respective vacuum chambers, the first and second embodiments show a means for purging nitrogen in the respective vacuum chambers and, thereafter, closing the sealing lids. The third embodiment shows a method of closing sealing lids in a vacuum state and, thereafter, purging the interiors of the respective vacuum chambers with nitrogen.

Figure 5A:
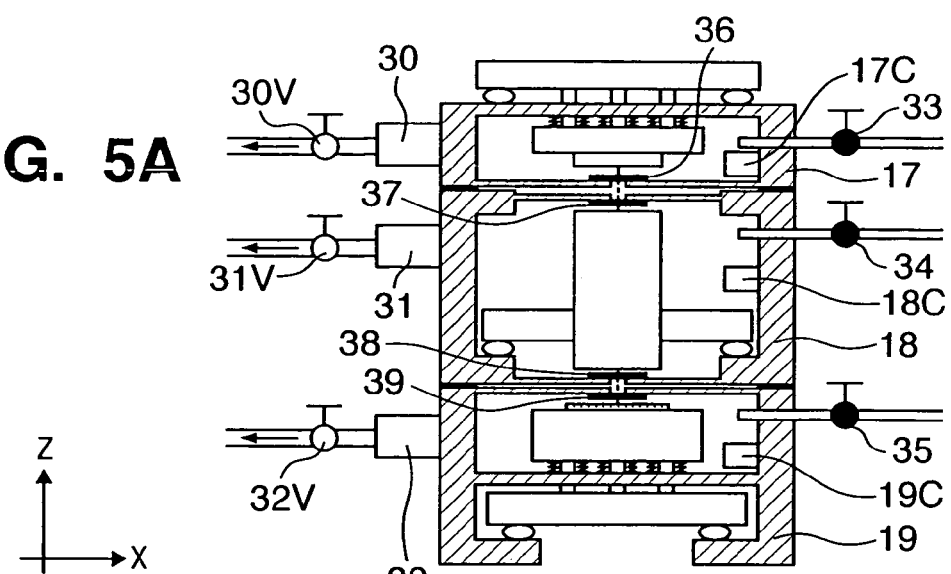
FIGS. 5A to 5C are views showing the structure of an exposure apparatus according to the third preferred embodiment of the present invention.

FIG. 5A shows a state wherein, while vacuum pump valves 30V to 32V are open, sealing lids 36 to 39 are closed to vacuum-maintain the interiors of the respective vacuum chambers by vacuum pumps 30 to 32.

Figure 5B:
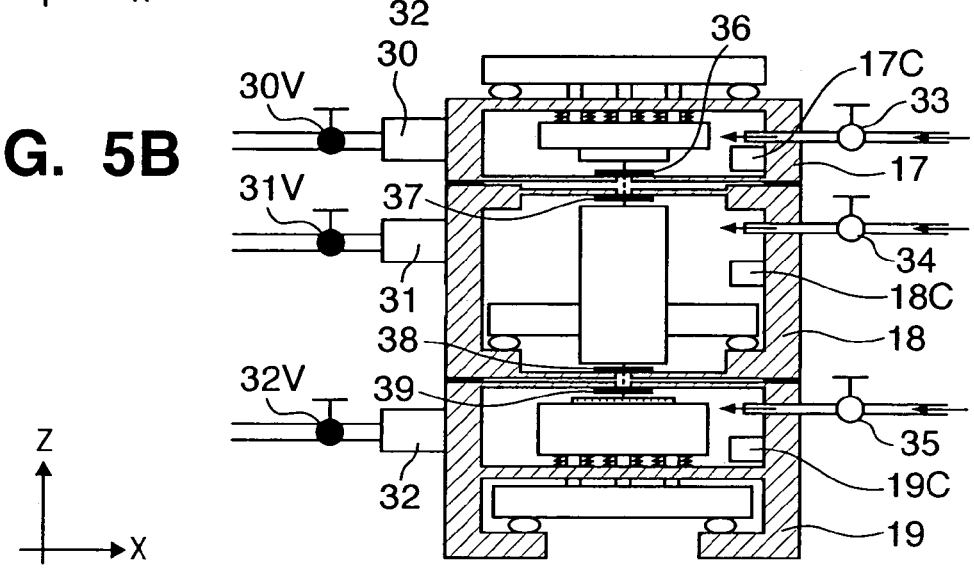

Subsequently, as shown in FIG. 5B, nitrogen purge valves 33 to 35 are opened and nitrogen gas is supplied into the respective vacuum chambers. In this case, the inner pressures of the respective vacuum chambers are adjusted to an atmospheric pressure by pressure gauges 17C to 19C provided in the respective vacuum chambers.

Figure 5C:
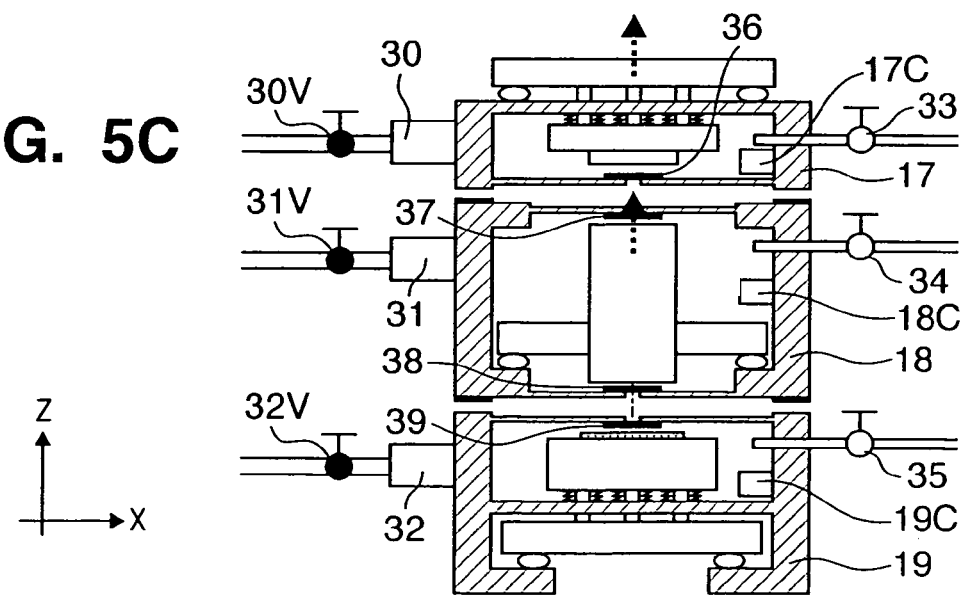

Subsequently, as shown in FIG. 5C, when the pressures in the respective vacuum chambers reach the atmospheric pressure, the modules of the respective vacuum chambers are separated and moved.

Figure 6A:
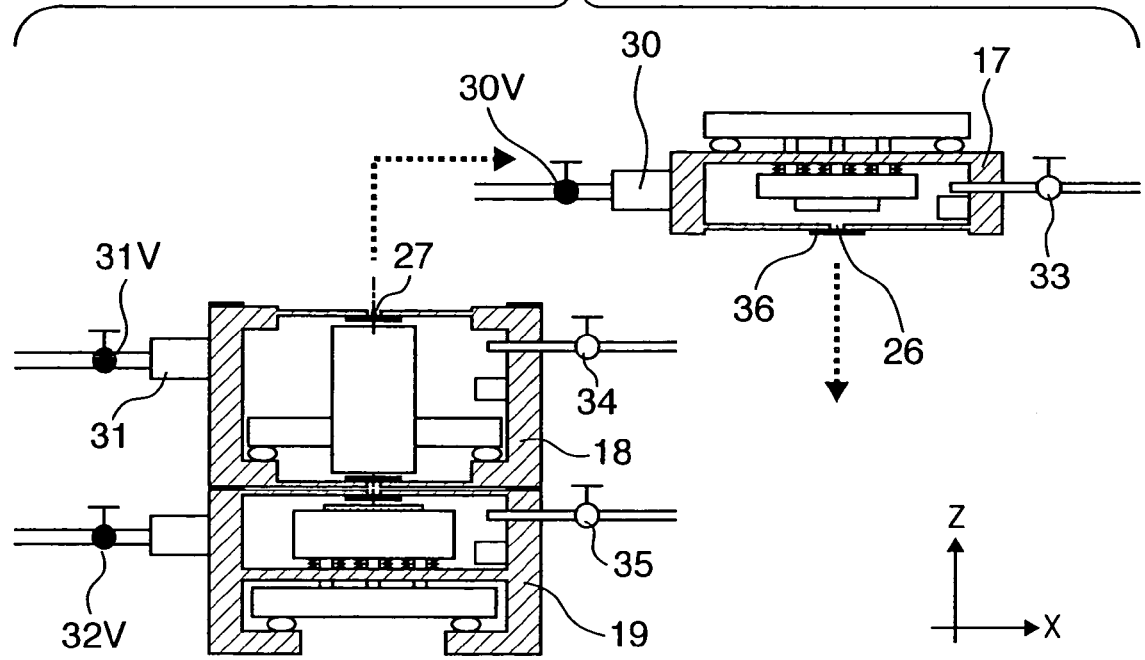
FIGS. 6A and 6B are views showing the structure of the exposure apparatus according to the third preferred embodiment of the present invention.
Figure 6B:
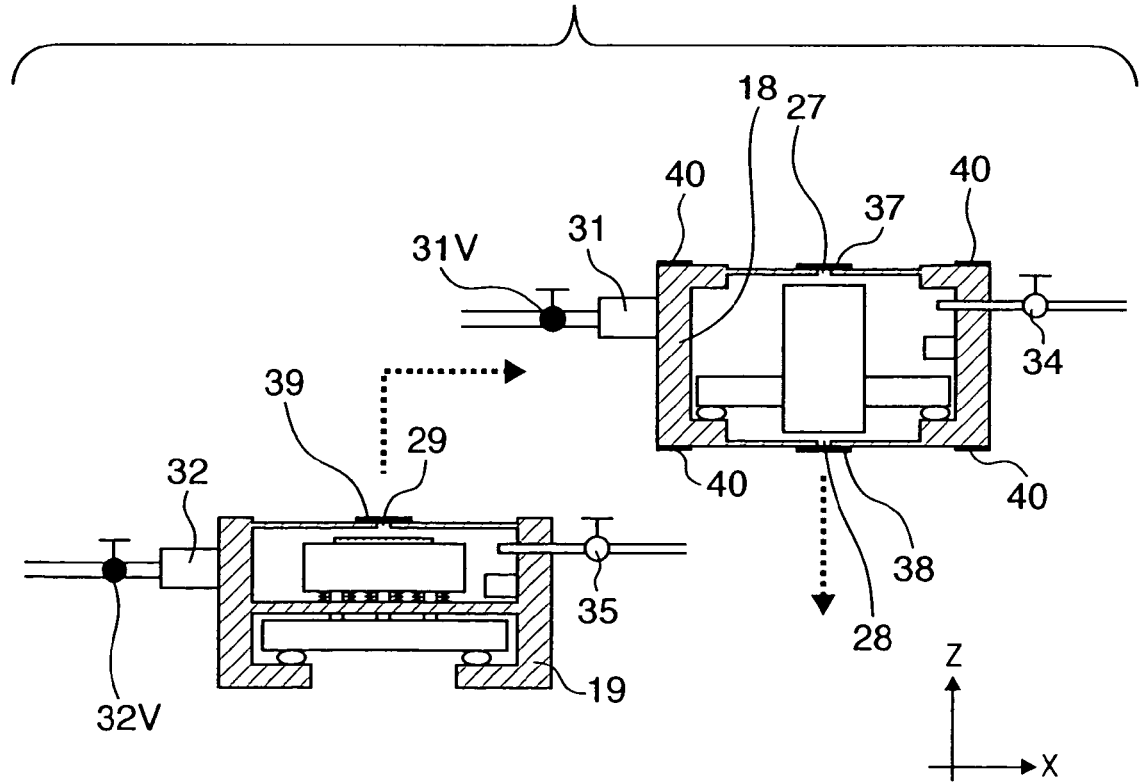

FIGS. 6A and 6B are views showing how to separate and move the modules of the respective vacuum chambers.

A vacuum chamber 17 is moved and separated upward, as shown in FIG. 6A. In this case, as an exposure light transmission hole 26 is closed by the sealing lid 36, the vacuum chamber 17 is separated while the purge enclosed state is maintained.

Similarly, a vacuum chamber 18 is moved and separated upward, as shown in FIG. 6B. In this case, as an exposure light transmission hole 27 and exposure light transmission hole 28 are closed by the sealing lid 37 and sealing lid 38, the vacuum chamber 18 is separated while the purge enclosed state is maintained. As an exposure light transmission hole 29 is closed by the sealing lid 39, a vacuum chamber 19 is separated while the purge enclosed state is maintained.

Fourth Embodiment

FIGS. 7 to 13 are views showing an exposure apparatus according to the fourth preferred embodiment of the present invention.

The first to third embodiments show a case wherein the modules of the respective vacuum chambers are to be separated and exchanged or separated and transported. The fourth embodiment shows a method of maintaining or exchanging the modules in the respective vacuum chambers.

Figure 7:
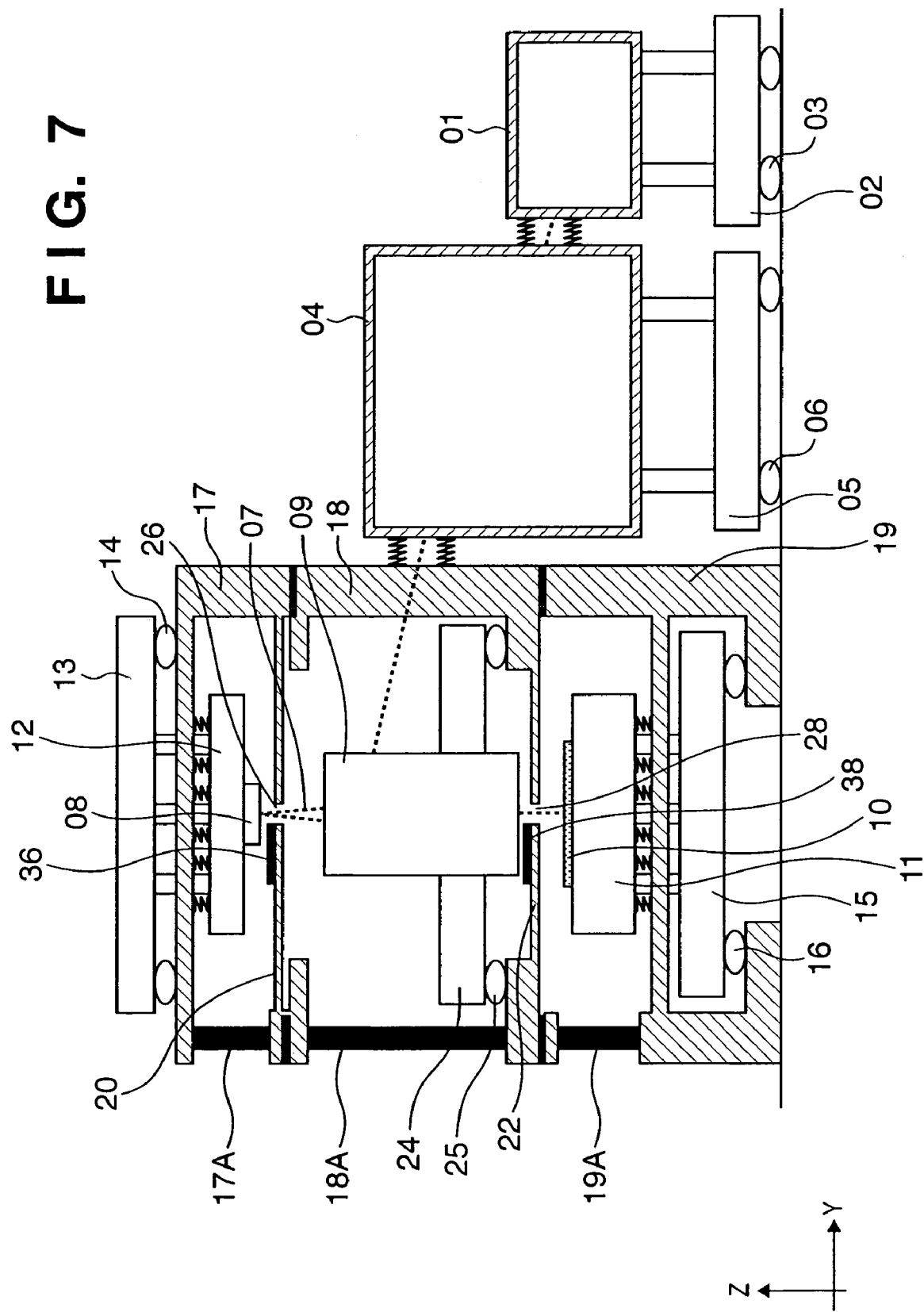
FIG. 7 is a view showing the structure of an exposure apparatus according to the fourth preferred embodiment of the present invention.

In FIG. 7, a separating partition 20 is arranged between a vacuum chamber 17 and vacuum chamber 18. The separating partition 20 has an exposure light transmission hole 26 and a sealing lid 36, which closes the exposure light transmission hole 26. As a maintenance opening, a vacuum chamber maintenance window 17A is formed in the side wall of the vacuum chamber 17.

Similarly, a separating partition 22 is arranged between the vacuum chamber 18 and a vacuum chamber 19. The separating partition 22 has an exposure light transmission hole 28 and a sealing lid 38, which closes the exposure light transmission hole 28. As maintenance openings, a vacuum chamber maintenance window 18A and vacuum chamber maintenance window 19A are respectively formed in the side walls of the vacuum chamber 18 and vacuum chamber 19.

FIGS. 8 to 13 show a case in the above structure wherein the modules in the respective vacuum chambers are to be maintained or exchanged.

Figure 8:
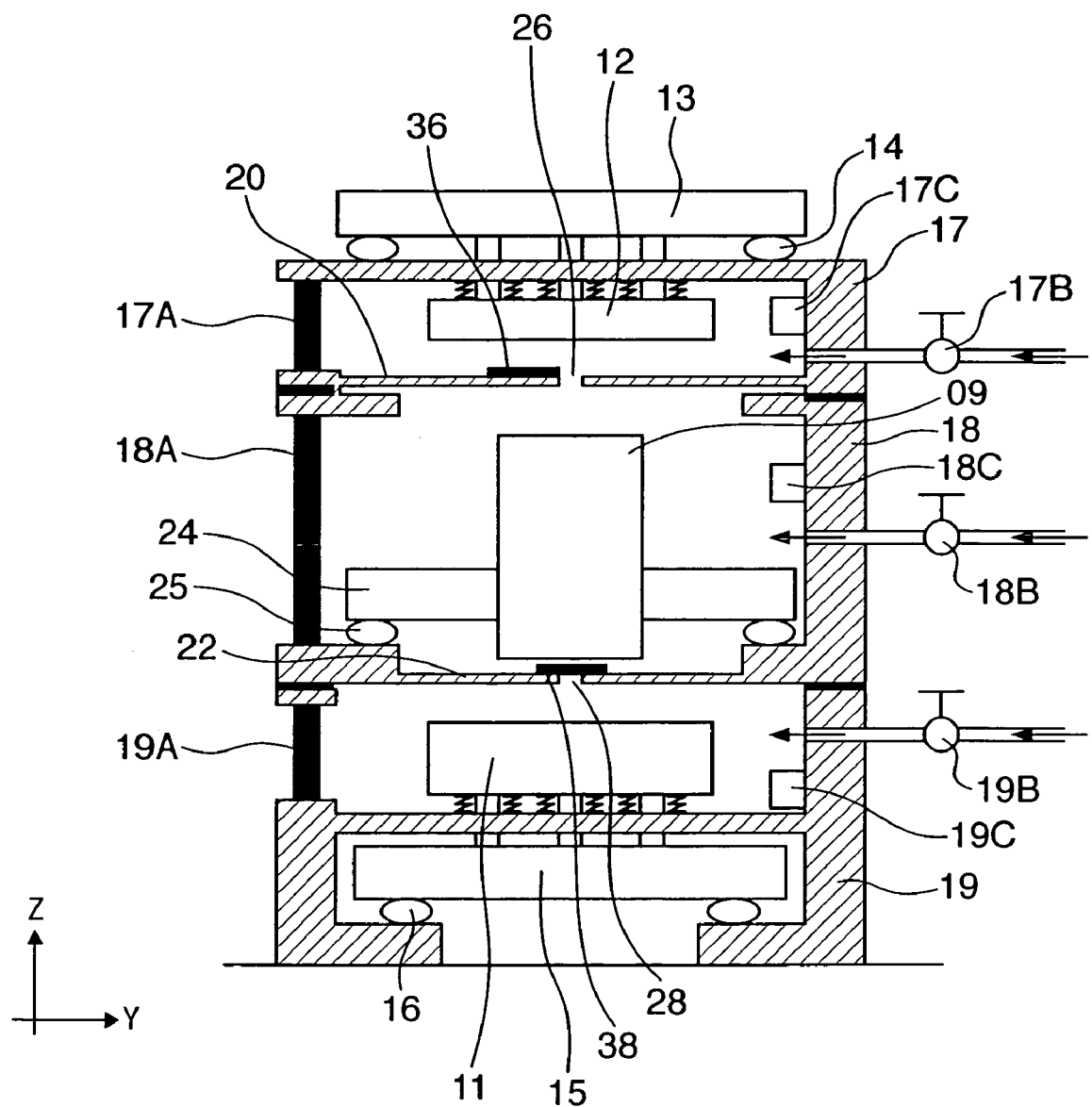
FIG. 8 is a view showing the structure of the exposure apparatus according to the fourth preferred embodiment of the present invention.
Figure 9:
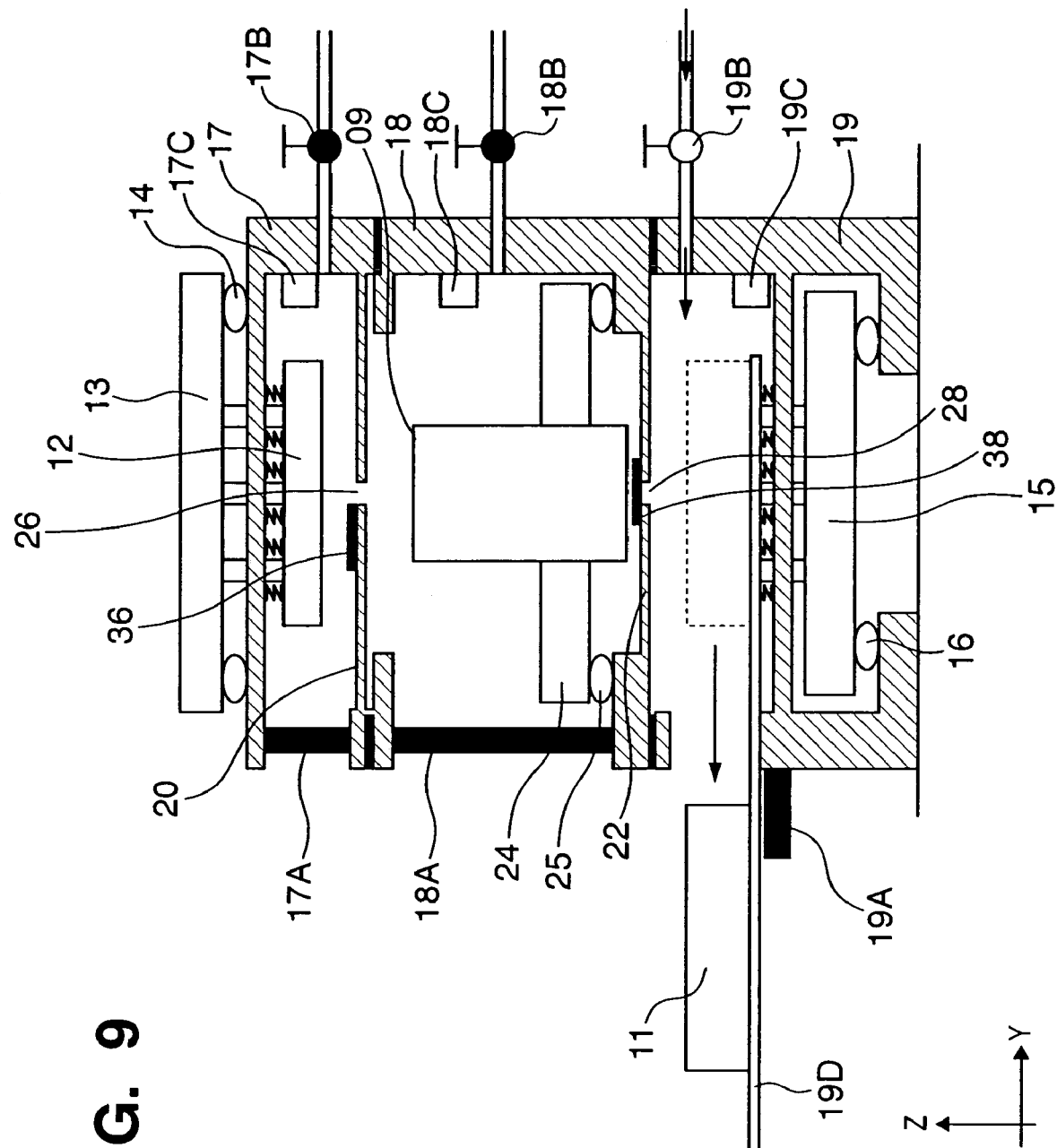
FIG. 9 is a view showing the structure of the exposure apparatus according to the fourth preferred embodiment of the present invention.

FIGS. 8 and 9 show a case wherein a wafer stage 11 is to be subjected to maintenance or module exchange.

As shown in FIG. 8, first, the sealing lid 38 is closed. Nitrogen purge and dry air valves 17B and 18B are opened and nitrogen is supplied to purge the interiors of the vacuum chamber 17 and vacuum chamber 18 to an atmospheric pressure state. Regarding the vacuum chamber 19, dry air is supplied from a nitrogen purge and dry air valve 19B to purge the interior of the vacuum chamber 19 with the dry air to an atmospheric pressure state.

Subsequently, as shown in FIG. 9, the nitrogen purge and dry air valves 17B and 18B are closed. While supplying dry air from the nitrogen purge and dry air valve 19B, the vacuum chamber maintenance window 19A is opened. An unloading guide 19D is inserted from the vacuum chamber maintenance window 19A to guide the wafer stage 11. The wafer stage 11 is unloaded outside the vacuum chamber 19 by an air levitating method (not shown), rolling wheel (not shown) method, or the like.

Figure 10:
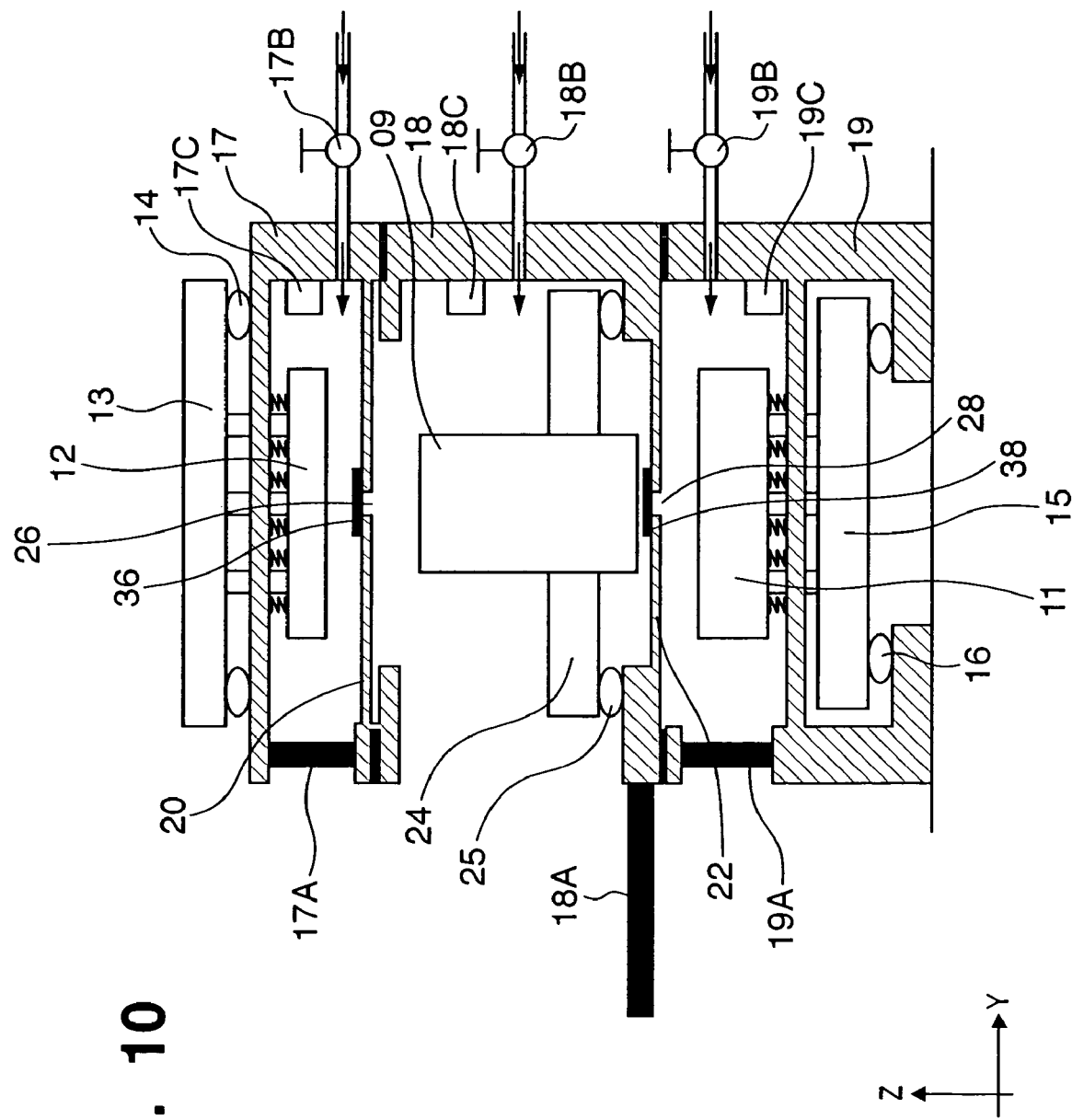
FIG. 10 is a view showing the structure of the exposure apparatus according to the fourth preferred embodiment of the present invention.
Figure 11:
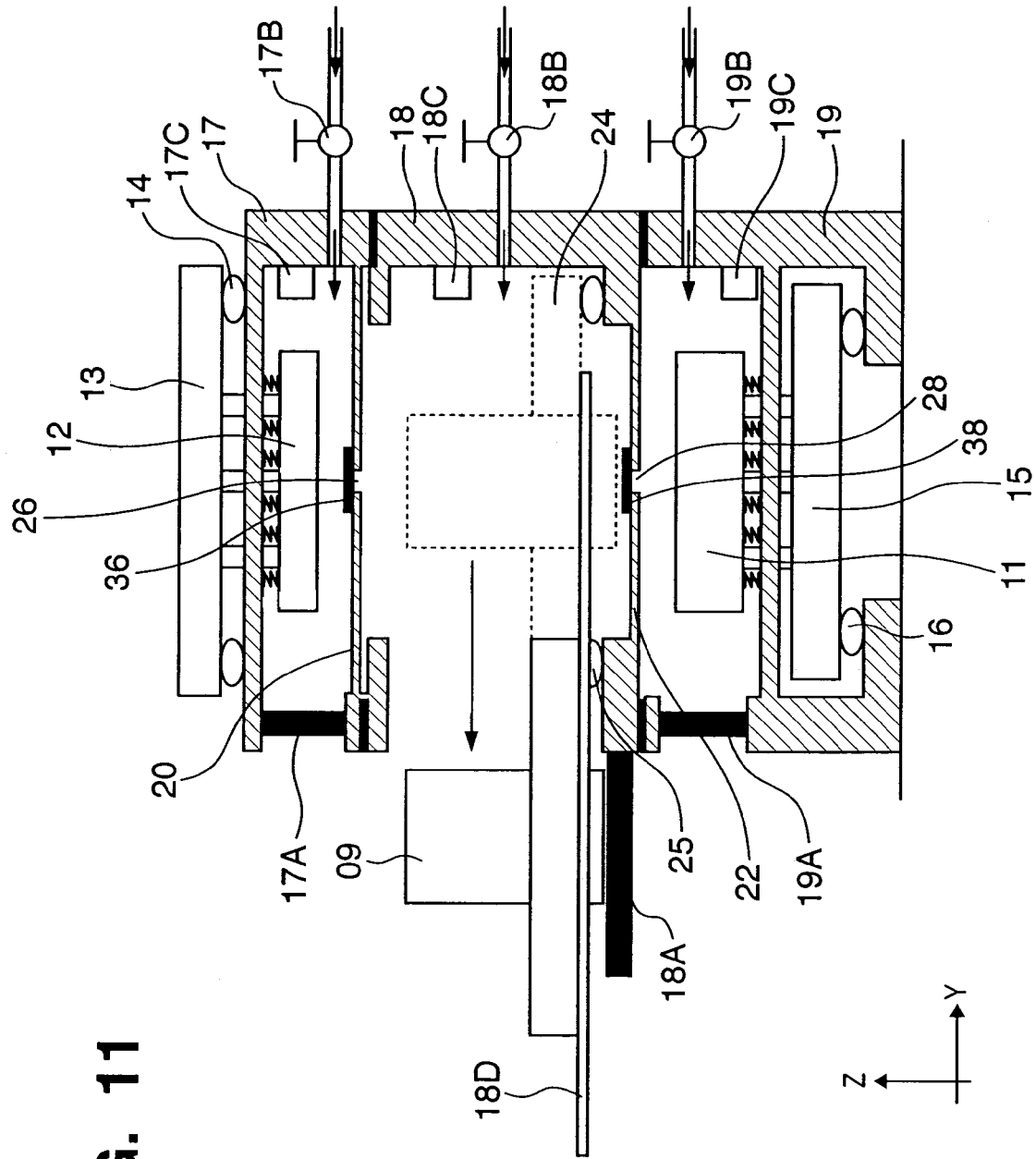
FIG. 11 is a view showing the structure of the exposure apparatus according to the fourth preferred embodiment of the present invention.

FIGS. 10 and 11 show a case wherein a projection optical system 9 is to be subjected to maintenance or module exchange.

As shown in FIG. 10, first, the sealing lid 36 and sealing lid 38 are closed. Nitrogen purge and dry air valves 17B and 19B are opened and nitrogen is supplied to purge the interiors of the vacuum chamber 17 and vacuum chamber 19 with nitrogen to an atmospheric pressure state. Regarding the vacuum chamber 18, dry air is supplied from the nitrogen purge and dry air valve 18B to purge the interior of the vacuum chamber 18 with the dry air to an atmospheric pressure state.

Subsequently, as shown in FIG. 11, the nitrogen purge and dry air valves 17B and 19B are closed. While supplying dry air from the nitrogen purge and dry air valve 18B, the vacuum chamber B maintenance window 18A is opened. An unloading guide 18D is inserted from the vacuum chamber B maintenance window 18A to guide the projection optical system 9. The projection optical system 9 is unloaded by the air levitating method (not shown), rolling wheel (not shown) method, or the like.

Figure 12:
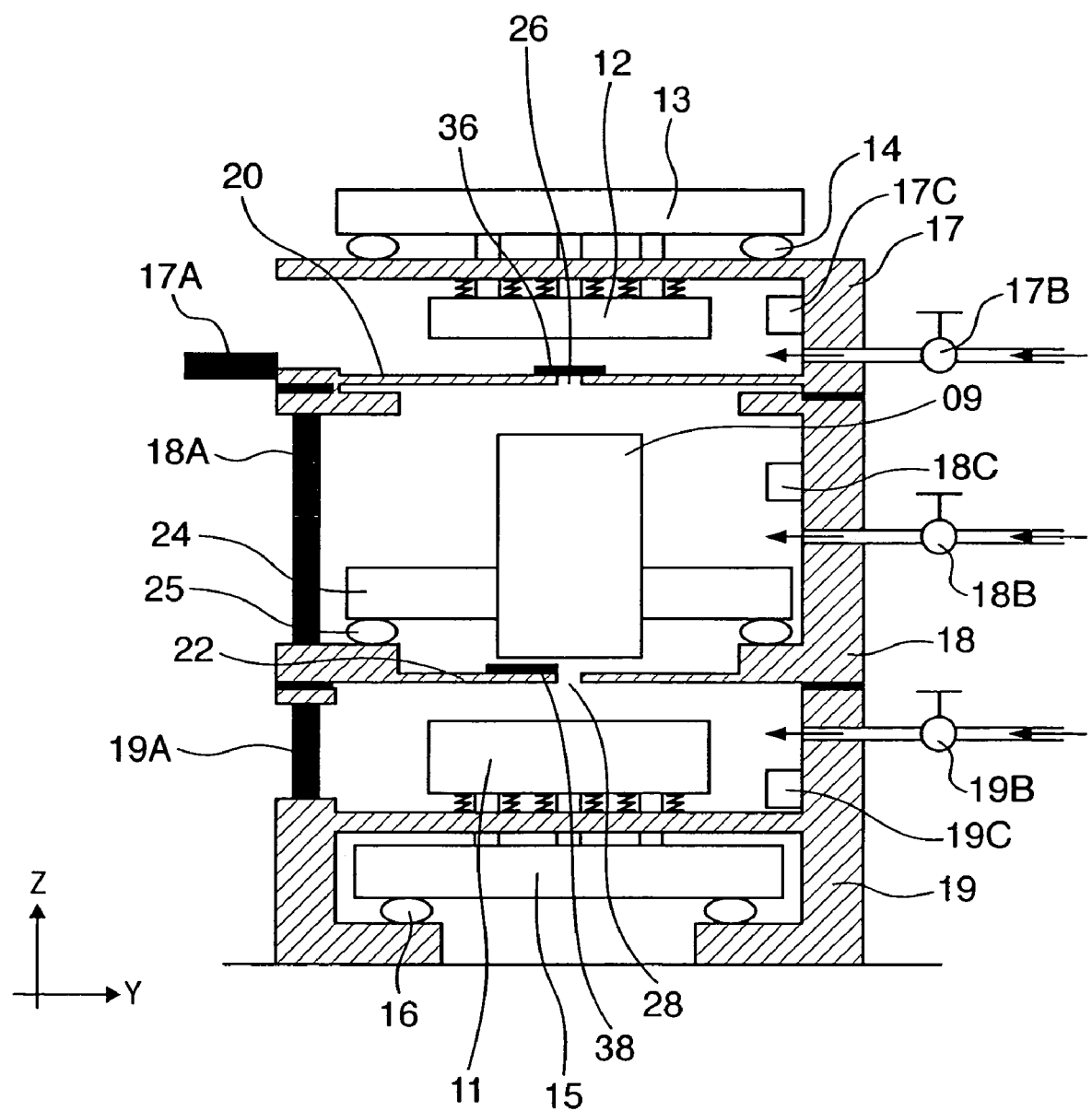
FIG. 12 is a view showing the structure of the exposure apparatus according to the fourth preferred embodiment of the present invention.
Figure 13:
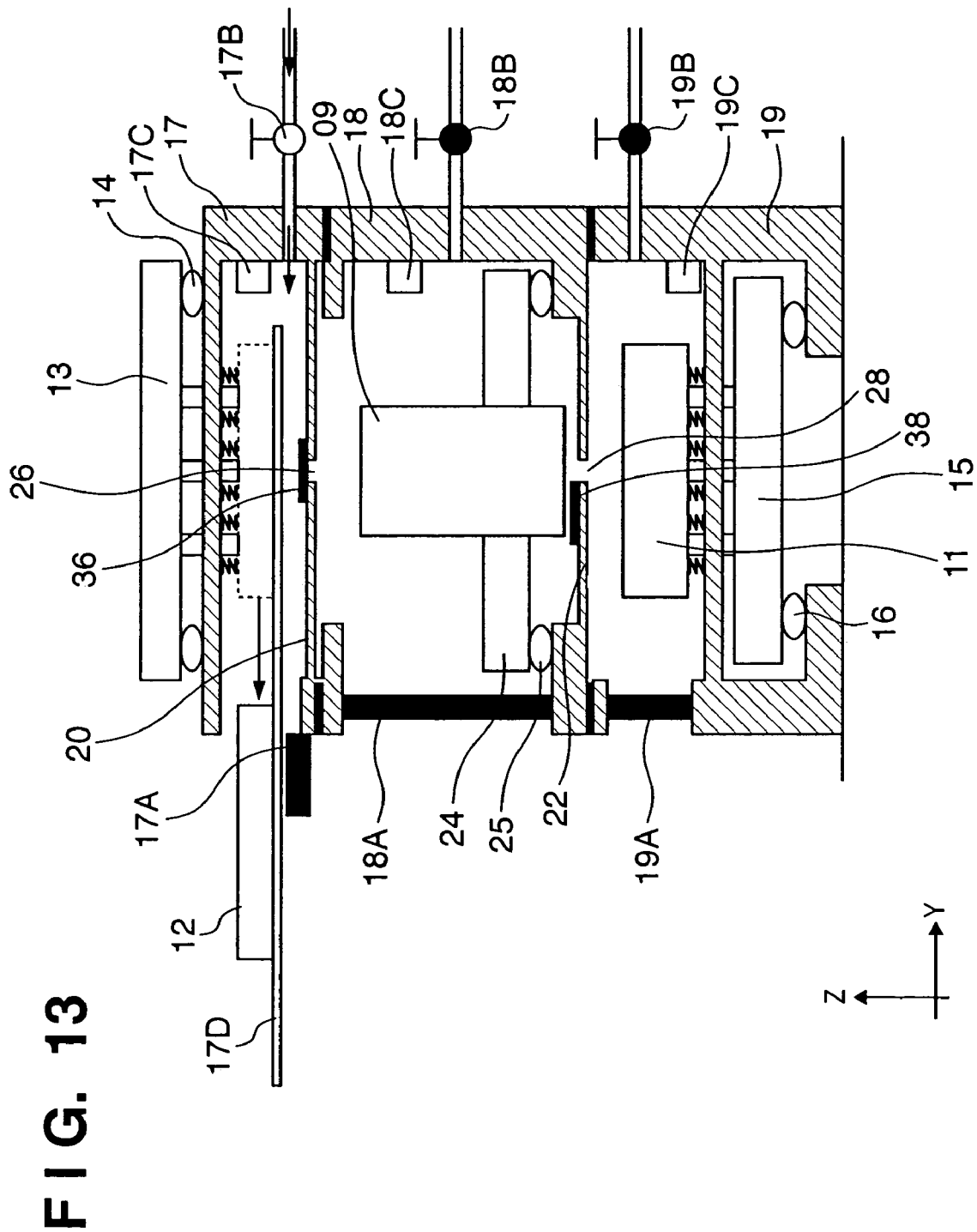
FIG. 13 is a view showing the structure of the exposure apparatus according to the fourth preferred embodiment of the present invention.

FIGS. 12 and 13 show a case wherein a reticle stage 12 is to be subjected to maintenance or module exchange.

As shown in FIG. 12, first, the sealing lid 36 is closed. The nitrogen purge and dry air valves 18B and 19B are opened, and nitrogen is supplied to purge the interiors of the vacuum chamber 18 and vacuum chamber 19 with nitrogen to an atmospheric pressure state. Regarding the vacuum chamber 17, dry air is supplied from the nitrogen purge and dry air valve 17B to purge the interior of the vacuum chamber 17 with the dry air to an atmospheric pressure state.

Subsequently, as shown in FIG. 13, the nitrogen purge and dry air valves 18B and 19B are closed. While supplying dry air from the nitrogen purge and dry air valve 17B, the vacuum chamber maintenance window 17A is opened. An unloading guide 17D is inserted from the vacuum chamber maintenance window 17A to guide the reticle stage 12. The reticle stage 12 is unloaded by the air levitating method (not shown), rolling wheel (not shown) method, or the like.

Fifth Embodiment

Figure 14:
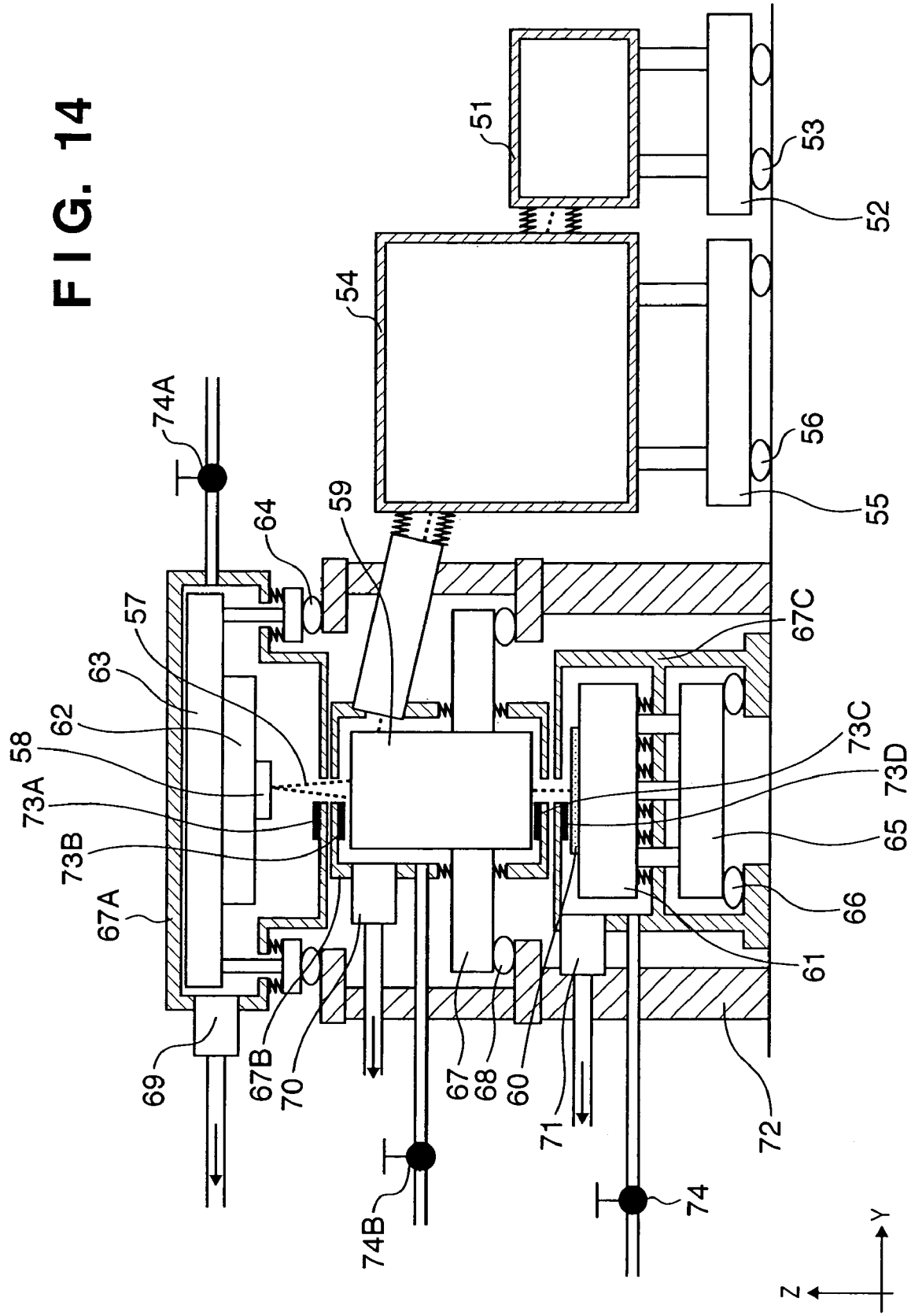
FIG. 14 is a view showing the structure of an exposure apparatus according to the fifth preferred embodiment of the present invention.
Figure 15A:
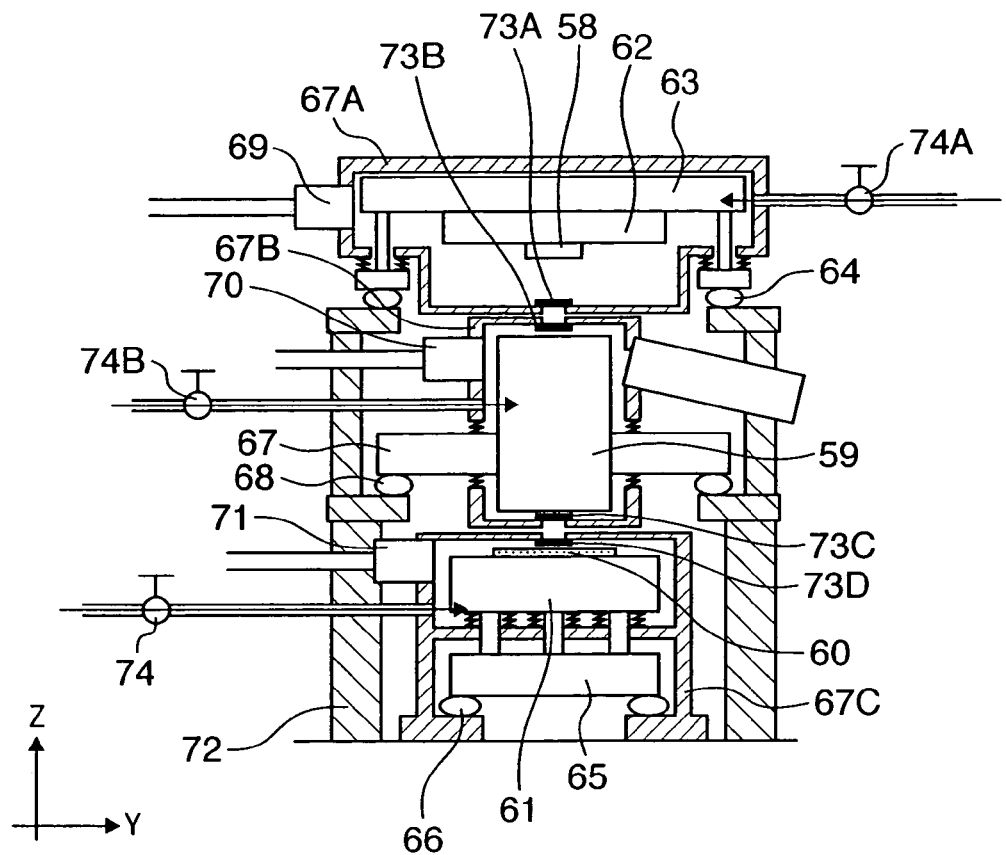
FIGS. 15A and 15B are views showing the structure of the exposure apparatus according to the fifth preferred embodiment of the present invention.
Figure 15B:
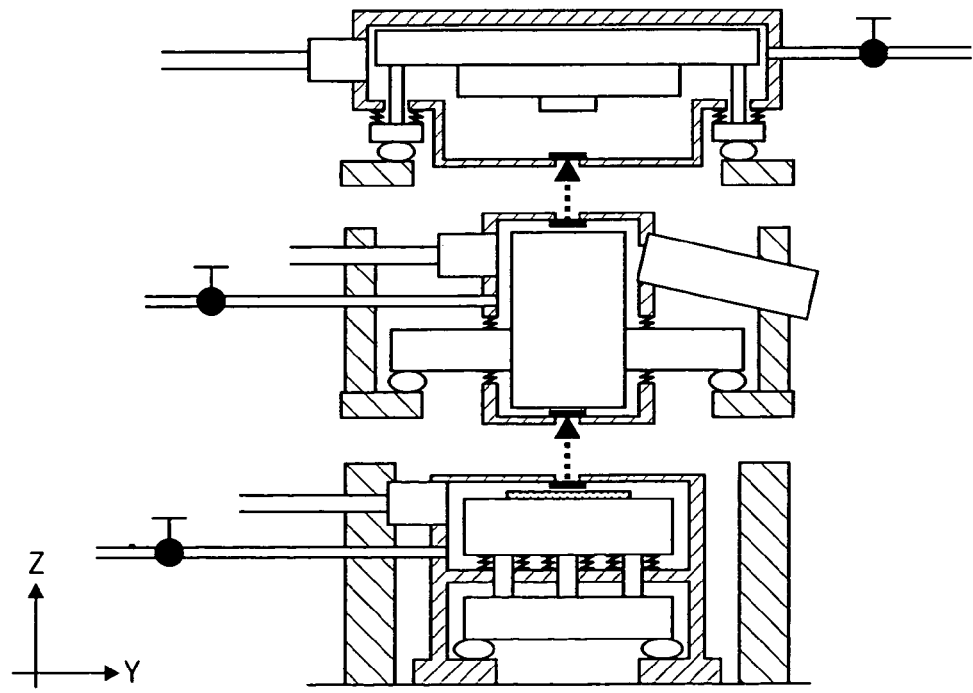
Figure 16:
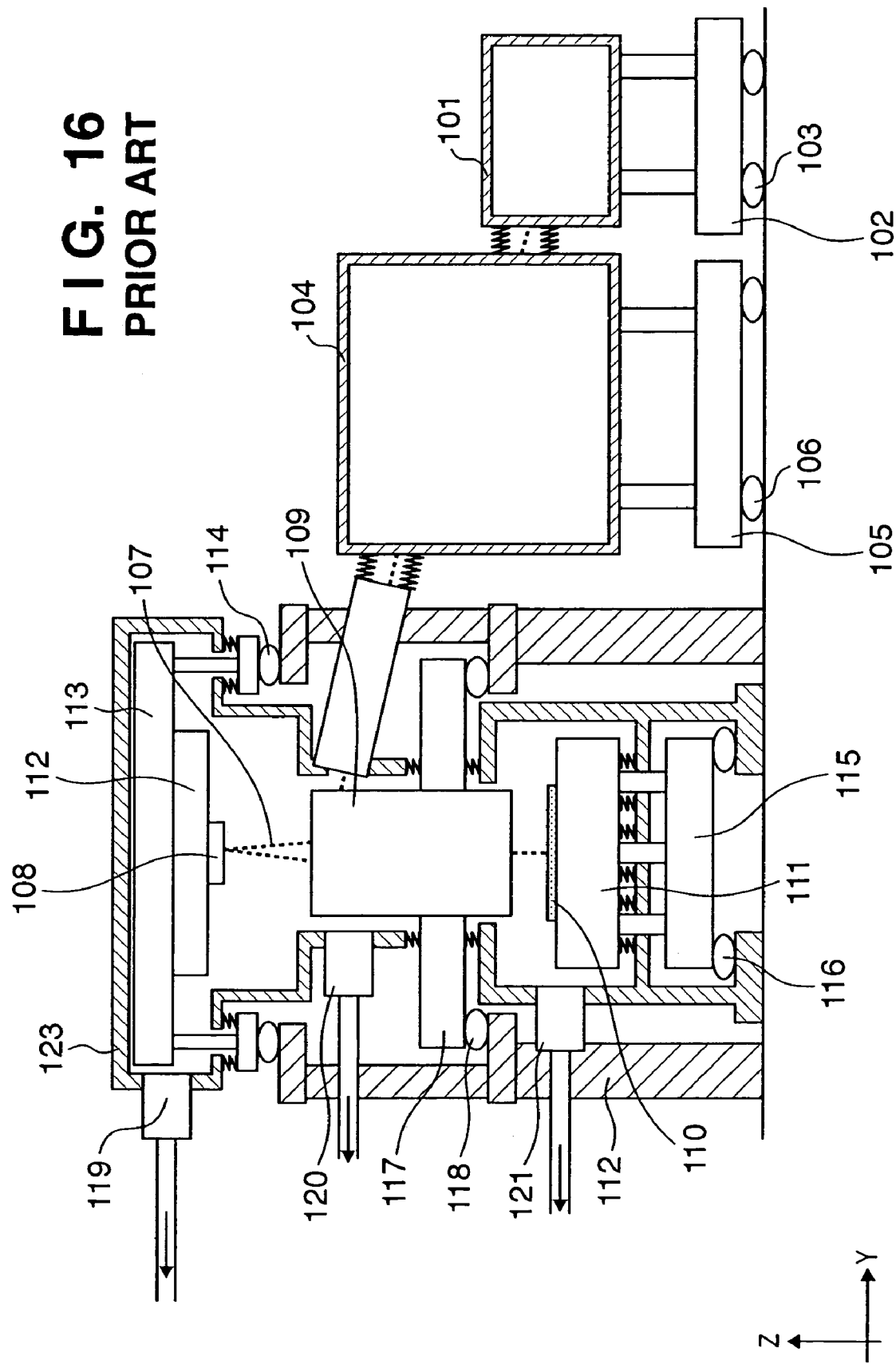
FIG. 16 is a view showing the structure of a conventional exposure apparatus.
Figure 17A:
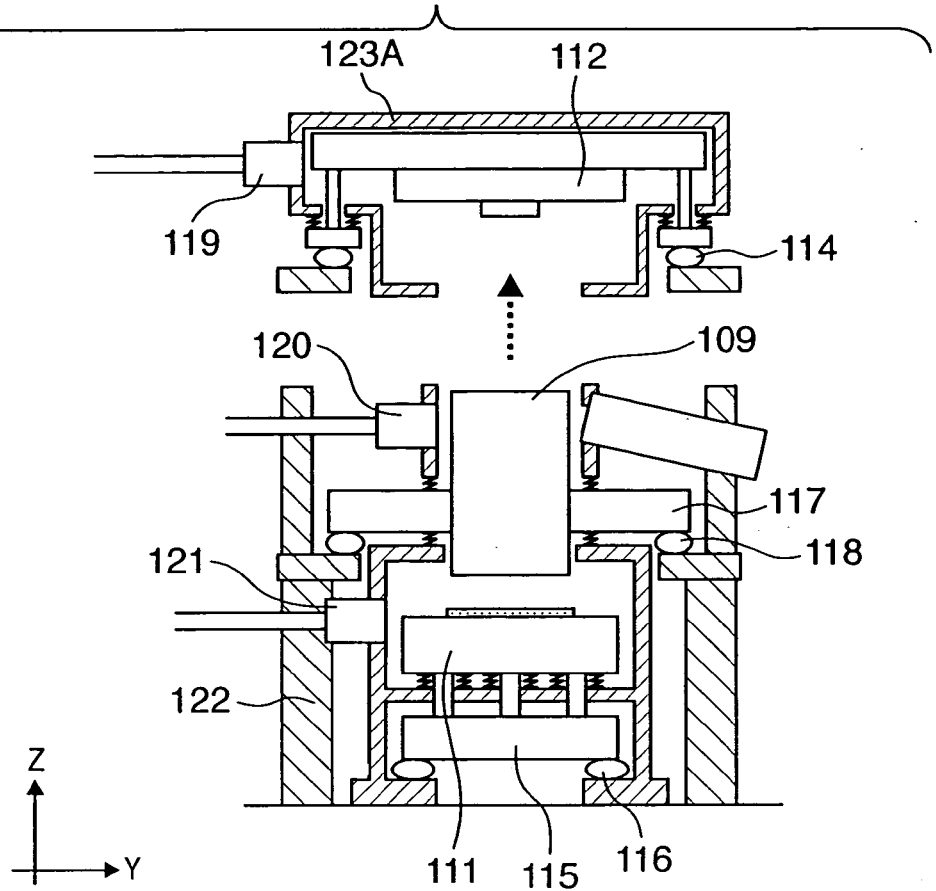
FIGS. 17A and 17B are views showing the structure of the conventional exposure apparatus.
Figure 17B:
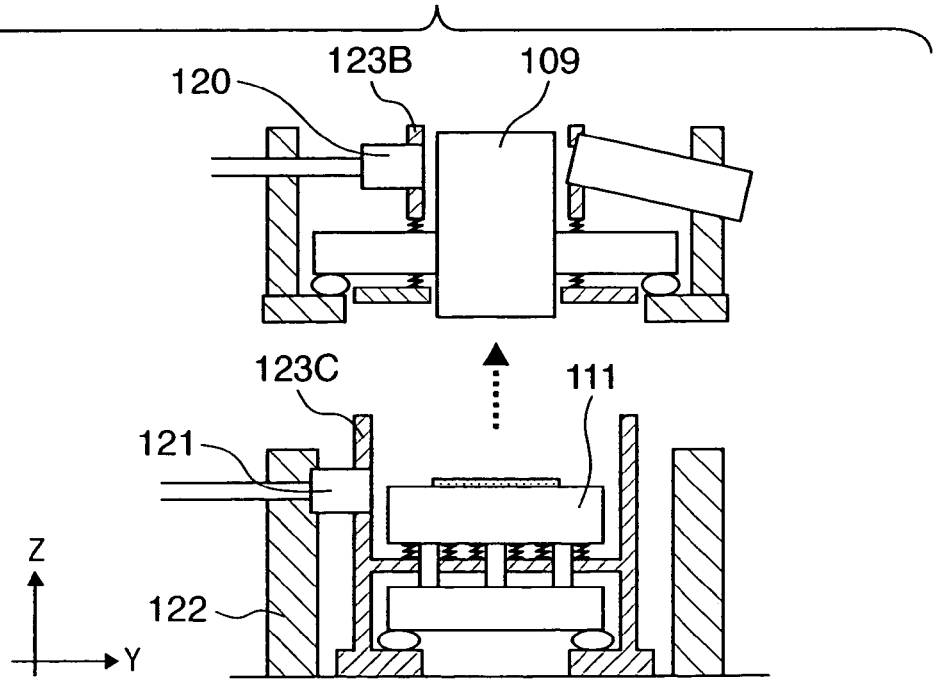

FIGS. 14, 15A, and 15B are views showing an exposure apparatus according to the fifth preferred embodiment of the present invention.

The first to fourth embodiments show how to maintain the modules in the vacuum chambers with the main body structure and vacuum chambers that are integral. The fifth embodiment shows a case wherein the main body structure and vacuum chambers form separate structures. The differences of the fifth embodiment from the first to fourth embodiments will be mainly described hereinafter.

In the fifth embodiment, a vacuum chamber 67A, vacuum chamber 67B, vacuum chamber 67C, and main body structure 72 form separate structures. A reticle stage 62 and reticle stage mount surface plate 63 are anti-vibrated and supported with respect to the main body structure 72 through a reticle stage mount 64. A projection optical system 59 and projection system mount surface plate 67 are anti-vibrated and supported with respect to the main body structure 72 through a projection system mount 68. A wafer stage 61 and wafer stage mount surface plate 65 are anti-vibrated and supported with respect to the floor through a wafer stage mount 66.

FIGS. 15A and 15B show an embodiment in which the respective vacuum chambers and main body structure described above are divided and exchanged or divided and transported with the above arrangement.

As shown in FIG. 15A, a nitrogen purge and dry air valve 74A is opened and nitrogen or dry air is supplied to purge the vacuum chamber 67A with nitrogen or dry air. A nitrogen purge and dry air valve 74B is opened, and nitrogen or dry air is supplied to purge the vacuum chamber 67B with nitrogen or dry air. A nitrogen purge and dry air valve 74C is opened, and nitrogen or dry air is supplied to purge the vacuum chamber 67C with nitrogen or dry air. To divide the respective vacuum chambers and main body structure, gate valves 73A to 73D are opened, and nitrogen is supplied from the nitrogen purge and dry air valves 74A to 74C to purge the interiors of the vacuum chambers to an atmospheric pressure.

Subsequently, as shown in FIG. 15B, the gate valves 73A to 73D are closed, and the main body structure 72 is divided to divide the modules of the respective vacuum chambers. Consequently, the respective vacuum chambers and main body structure can be maintained and exchanged, or divided and transported.

In this manner, according to the present invention, contamination in the chambers can be decreased.

[Application]

Figure 18:
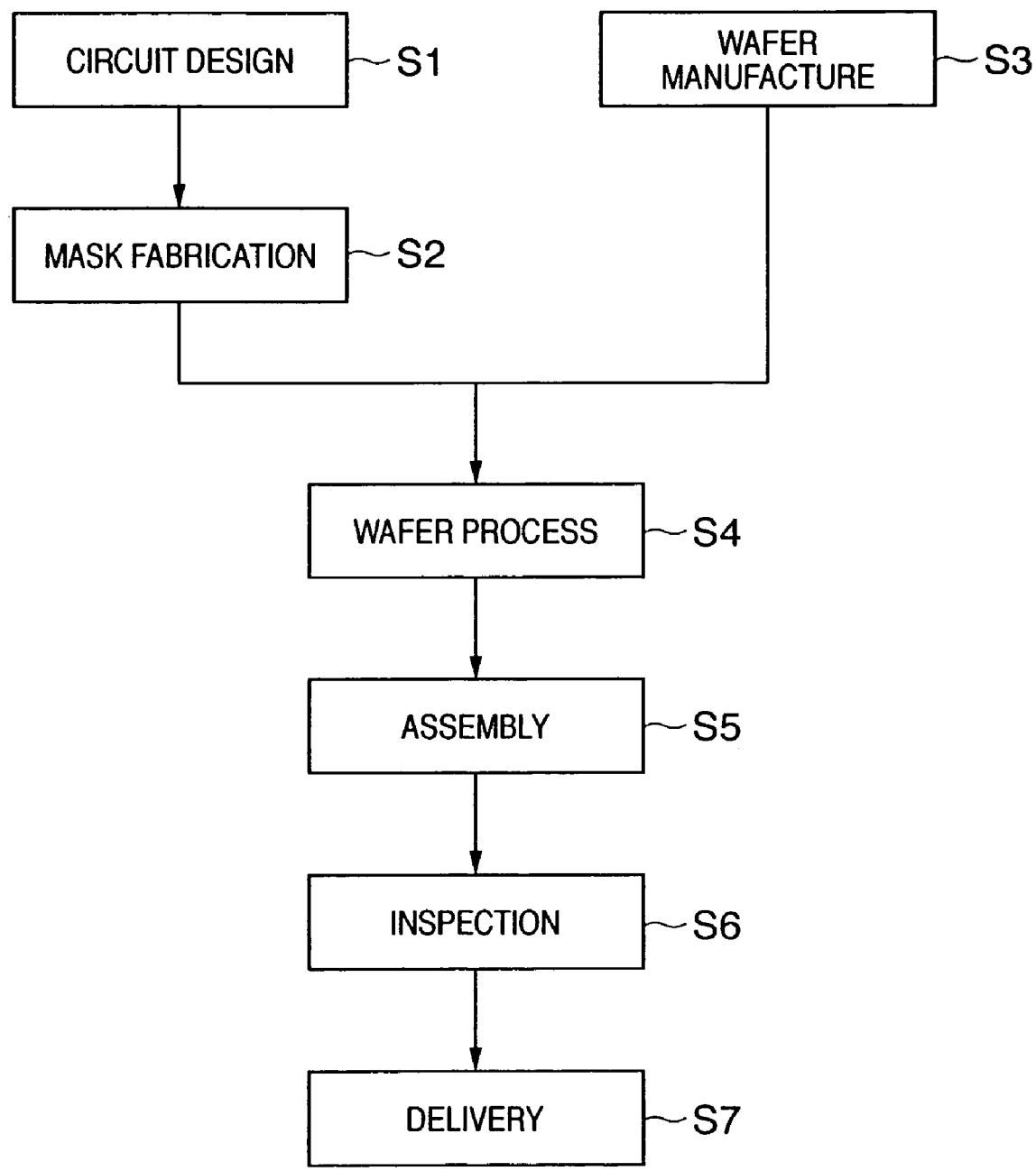
FIG. 18 is a flowchart showing the flow of an entire semiconductor device manufacturing process.

A semiconductor device manufacturing process, which uses this exposure apparatus, will be described. FIG. 18 is a flowchart showing the flow of the entire semiconductor device manufacturing process. In step 1 (circuit design), the circuit of a semiconductor device is designed. In step 2 (mask fabrication), a mask is fabricated on the basis of the designed circuit pattern. In step 3 (wafer manufacture), a wafer is manufactured using a material such as silicon. In step 4 (wafer process), called a preprocess, an actual circuit is formed on the wafer by the above exposure apparatus in accordance with lithography, using the fabricated mask and wafer. In the next step, step 5 (assembly), called a post-process, a semiconductor chip is formed from the wafer fabricated in step 4. This step includes assembly processes, such as assembly (dicing and bonding) and packaging (chip encapsulation). In step 6 (inspection), inspections including an operation check test and a durability test of the semiconductor device fabricated in step 5 are performed. A semiconductor device is finished with these steps, and delivered, in step 7.

The wafer process of step 4 includes the following steps, i.e., an oxidation step of oxidizing the surface of the wafer, a CVD step of forming an insulating film on the wafer surface, an electrode formation step of forming an electrode on the wafer by deposition, an ion implantation step of implanting ions in the wafer, a resist process step of applying a photosensitive agent to the wafer, an exposure step of transferring the circuit pattern to the wafer after the resist process step by the exposure apparatus described above, a developing step of developing the wafer exposed in the exposure step, an etching step of removing portions other than the resist image developed in the developing step, and a resist removal step of removing any unnecessary resist after etching. These steps are repeated to form multiple circuit patterns on the wafer.

When the exposure apparatus with improved alignment accuracy is applied to the semiconductor device manufacturing process in this manner, the packaging density and feature size of the patterns of a semiconductor integrated circuit, or the like, can be further increased and decreased, respectively.

As many apparently widely different embodiments of the present invention can be made without departing from the spirit and scope thereof, it is to be understood that the invention is not limited to the specific embodiments thereof, except as defined in the claims.

CLAIM OF PRIORITY

This application claims priority from Japanese Patent Application No. 2004-027125 filed on Feb. 3, 2004, which is hereby incorporated by reference herein.

What is claimed is:

1. An exposure apparatus comprising:
   a plurality of chambers which respectively have openings and are connected to each other to be able to communicate with each other through the openings; and
   a suppressing system which suppresses a gas from flowing into at least one of said plurality of chambers through the opening after disconnection of said plurality of chambers,
   wherein one of said plurality of chambers has a projection, another one of said plurality of chambers has a recess, and said one chamber and said another chamber are connected to each other as the projection is fitted in the recess.

2. An apparatus according to claim 1, wherein said suppressing system is provided with respect to each of said plurality of chambers.

3. An apparatus according to claim 1, wherein said suppressing system comprises a sealing lid which seals the opening.

4. An apparatus according to claim 1, wherein said suppressing system has a supply system which supplies a gas into at least one of said plurality of chambers.

5. An apparatus according to claim 4, wherein the gas comprises at least one of an inert gas and dry air.

6. An apparatus according to claim 1, wherein said one chamber has a seal member around the projection.

7. An apparatus according to claim 6, wherein said another chamber has a seal member around the recess.

8. A device manufacturing method comprising steps of:
   transferring a pattern to an object using an exposure apparatus as defined in claim 1; and
   developing the object to which the pattern has been transferred.

9. An exposure apparatus which has a projection optical system and projects a pattern of an original held by an original stage onto a substrate held by a substrate stage using exposure light through the projection optical system, said apparatus comprising:
   a first chamber which accommodates the original stage;
   a second chamber which accommodates the projection optical system; and
   a third chamber which accommodates the substrate stage, wherein said first, second and third chambers are connected to one another and respectively have openings through which the exposure light passes and wherein one of said plurality of chambers has a projection, another one of said plurality of chambers has a recess, and said one chamber and said another chamber are connected to each other as the projection is fitted in the recess, and
   said exposure apparatus further comprises a suppressing system which suppresses a gas from flowing into at least one of said first, second and third chambers through the opening after disconnection of said first, second and third chambers.

10. An apparatus according to claim 9, wherein said suppressing system is provided with respect to each of said first, second and third chambers.

* * * * *

UNITED STATES PATENT AND TRADEMARK OFFICE
CERTIFICATE OF CORRECTION

PATENT NO. : 7,130,016 B2  Page 1 of 1
APPLICATION NO. : 11/048762
DATED : October 31, 2006
INVENTOR(S) : Yoshikazu Miyajima It is certified that error appears in the above-identified patent and that said Letters Patent is hereby corrected as shown below:

ON THE TITLE PAGE:
In item "(56) References Cited," under "FOREIGN PATENT DOCUMENTS," the second-listed document, "JP 2821795 9/1998" should read -- JP 2,821,795 9/1998 --.

COLUMN 1:
Line 15, "Patent No. 02821795" should read -- Patent No. 2,821,795 --.

COLUMN 5:
Line 62, "the and space" should read -- and the space --.

COLUMN 7:
Line 22, "vacuum chamber B 18" should read -- vacuum chamber 18 --.
Line 31, "chambers position the" should read -- chambers and position the --.

Signed and Sealed this

Fourteenth Day of August, 2007

JON W. DUDAS
*Director of the United States Patent and Trademark Office*